US010651196B1

(12) United States Patent
    Sharangpani et al.

(10) Patent No.: US 10,651,196 B1
(45) Date of Patent:  May 12, 2020

(54) THREE-DIMENSIONAL MULTILEVEL DEVICE CONTAINING SEAMLESS UNIDIRECTIONAL METAL LAYER FILL AND METHOD OF MAKING SAME

(71) Applicant: SANDISK TECHNOLOGIES LLC, Addison, TX (US)

(72) Inventors: Rahul Sharangpani, Fremont, CA (US); Fei Zhou, San Jose, CA (US); Raghuveer S. Makala, Campbell, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/183,920

(22) Filed: Nov. 8, 2018

(51) Int. Cl.
    *H01L 27/11578* (2017.01)
    *H01L 27/11582* (2017.01)
    *H01L 27/1157* (2017.01)
    *H01L 27/11565* (2017.01)
    *H01L 21/768* (2006.01)
    *H01L 27/11556* (2017.01)
    *H01L 27/11519* (2017.01)
    *H01L 27/11524* (2017.01)

(52) U.S. Cl.
    CPC .. *H01L 27/11582* (2013.01); *H01L 21/76876* (2013.01); *H01L 27/1157* (2013.01); *H01L 27/11565* (2013.01); *H01L 27/11519* (2013.01); *H01L 27/11524* (2013.01); *H01L 27/11556* (2013.01)

(58) Field of Classification Search
    CPC ........... H01L 27/11273; H01L 27/1128; H01L 27/11517; H01L 27/11524; H01L 27/11529; H01L 27/11551; H01L 27/11578
    See application file for complete search history.

(56) References Cited

U.S. PATENT DOCUMENTS

| 5,915,167 | A  | 6/1999 | Leedy |
| 8,349,681 | B2 | 1/2013 | Alsmeier et al. |
| 9,230,983 | B1 | 1/2016 | Sharangpani et al. |

(Continued)

OTHER PUBLICATIONS

U.S. Appl. No. 15/593,916, filed May 12, 2017, SanDisk Technologies LLC.

(Continued)

*Primary Examiner* — Jae Lee
(74) *Attorney, Agent, or Firm* — The Marbury Law Group PLLC

(57) ABSTRACT

A vertical repetition of a unit layer stack including an insulating layer, a sacrificial material layer, and a nucleation promoter layer is formed over a substrate. Memory stack structures are formed through the vertical repetition. Each of the memory stack structures comprises a memory film and a vertical semiconductor channel. Backside recesses are formed by removing the sacrificial material layers selective to the insulating layers and the nucleation promoter layers within the vertical repetition. Electrically conductive layers are formed in the backside recesses by selectively growing a metallic material from physically exposed surfaces of the nucleation promoter layers while suppressing growth of the metallic material from physically exposed surfaces of the insulating layers.

13 Claims, 22 Drawing Sheets

(56) References Cited

U.S. PATENT DOCUMENTS

| | | | |
|---|---|---|---|
| 9,397,046 B1 | 7/2016 | Sharangpani et al. | |
| 9,496,419 B2 | 11/2016 | Sharangpani et al. | |
| 9,698,223 B2 | 7/2017 | Sharangpani et al. | |
| 9,768,270 B2 | 9/2017 | Gunji-Yoneoka et al. | |
| 9,780,182 B2 | 10/2017 | Peri et al. | |
| 9,793,139 B2 | 10/2017 | Sharangpani et al. | |
| 9,806,089 B2 | 10/2017 | Sharangpani et al. | |
| 9,842,907 B2 | 12/2017 | Makala et al. | |
| 9,984,963 B2 | 5/2018 | Peri et al. | |
| 10,115,735 B2 | 10/2018 | Amano et al. | |
| 10,115,897 B1 | 10/2018 | Sato | |
| 2015/0179662 A1 | 6/2015 | Makala et al. | |
| 2015/0380419 A1 | 12/2015 | Gunji-Yoneoka et al. | |
| 2016/0225866 A1 | 8/2016 | Peri et al. | |
| 2017/0062472 A1* | 3/2017 | Park | H01L 27/11582 |
| 2017/0069646 A1 | 3/2017 | Arisumi et al. | |
| 2017/0125538 A1 | 5/2017 | Sharangpani et al. | |
| 2017/0287925 A9 | 10/2017 | Makala et al. | |
| 2017/0352669 A1 | 12/2017 | Sharangpani et al. | |
| 2017/0373079 A1 | 12/2017 | Sharangpani et al. | |
| 2017/0373197 A1 | 12/2017 | Sharangpani et al. | |
| 2018/0019256 A1* | 1/2018 | Amano | H01L 27/11582 |
| 2018/0033646 A1 | 2/2018 | Sharangpani et al. | |
| 2018/0090373 A1 | 3/2018 | Sharangpani et al. | |
| 2018/0247954 A1 | 8/2018 | Amano et al. | |

OTHER PUBLICATIONS

U.S. Appl. No. 15/992,603, filed May 30, 2017, SanDisk Technologies LLC.

U.S. Appl. No. 16/020,008, filed Jun. 27, 2018, SanDisk Technologies LLC.

U.S. Appl. No. 16/020,088, filed Jun. 27, 2018, SanDisk Technologies LLC.

Endoh et al., "Novel Ultra High Density Memory with a Stacked-Surrounding Gate Transistor (S-SGT) Structured Cell," IEDM Proc., (2001), 33-36.

Harvey-Collard, P. et al., "Inductively Coupled Plasma Etching of Amorphous Silicon Nanostructures Over Nanotopography Using C4F8/SF6 Chemistry," Microelectronic Engineering, vol. 110, pp. 408-413, (2013).

Notification of Transmittal of the International Search Report and Written Opinion of the International Search Authority for International Patent Application No. PCT/US2019/046611, dated Nov. 27, 2019, 10 pages.

* cited by examiner

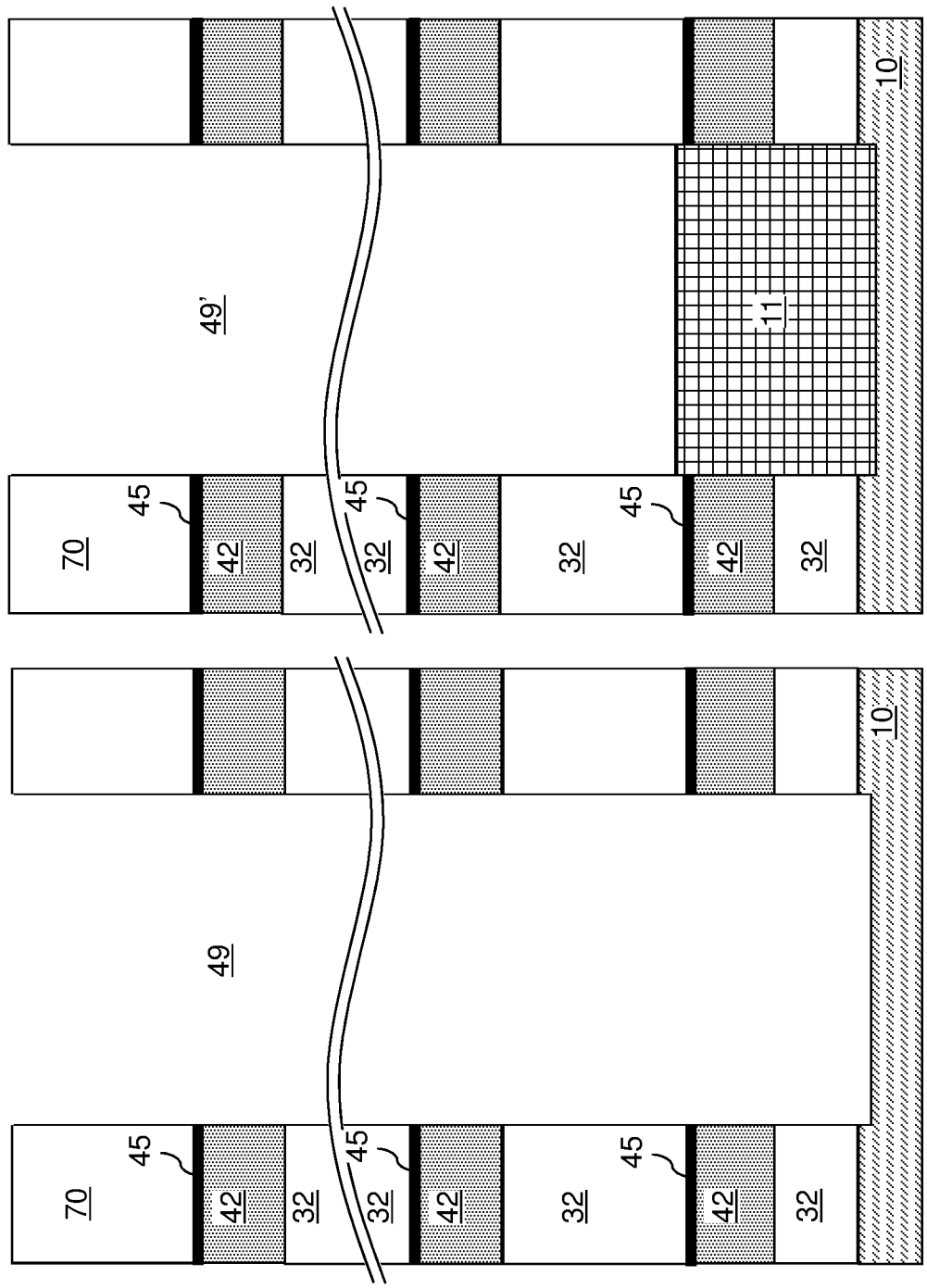

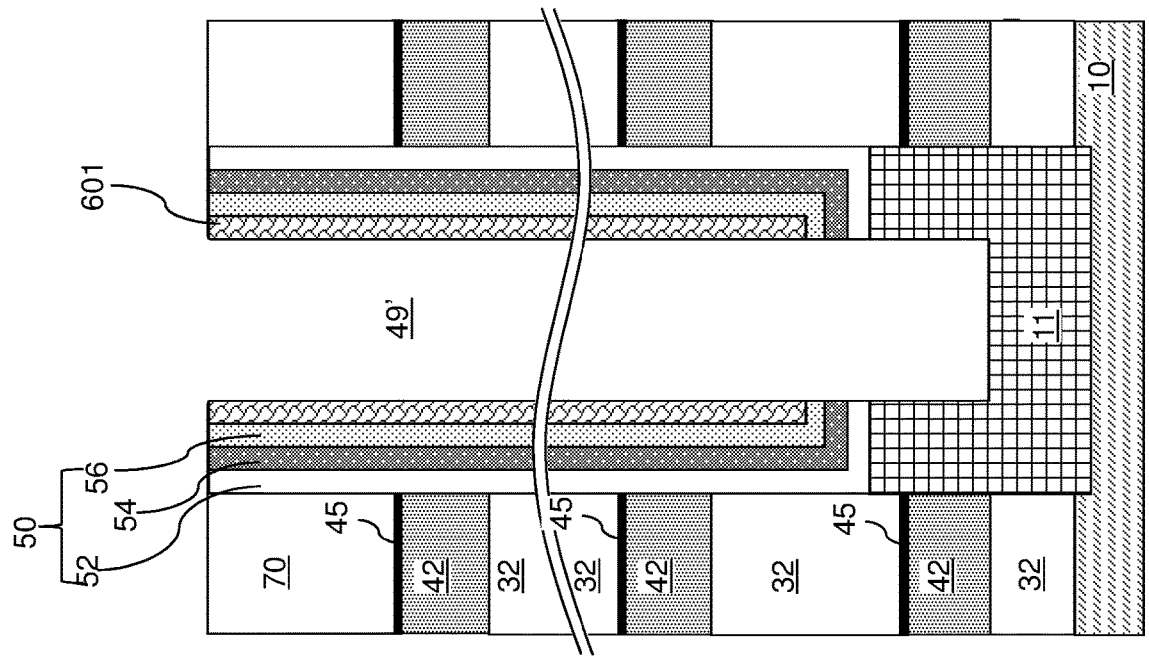
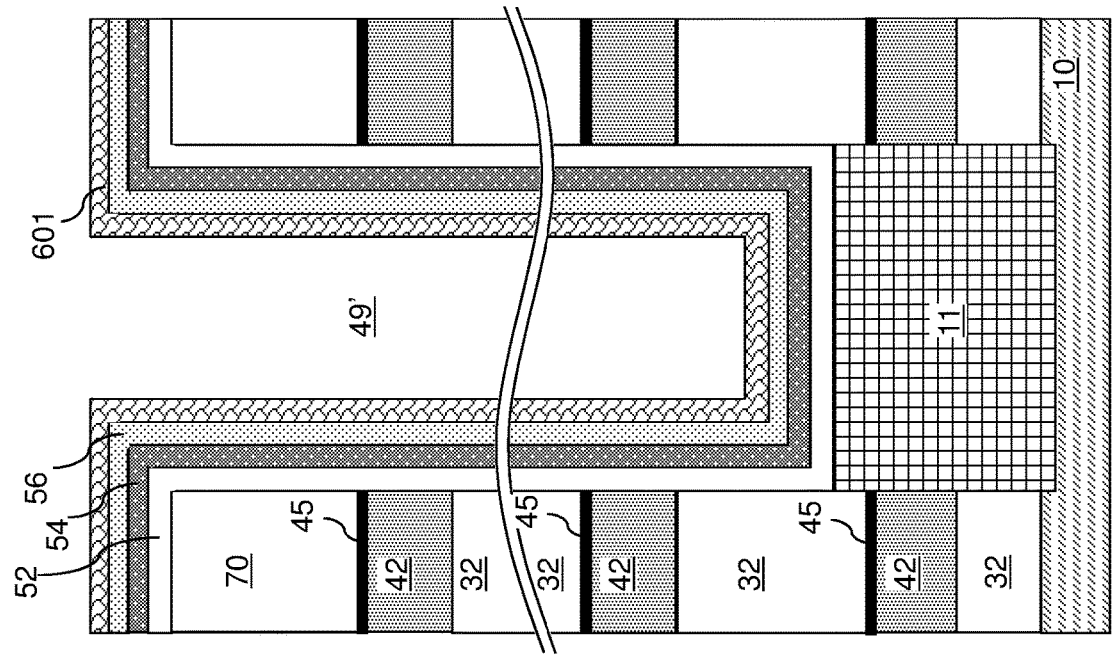

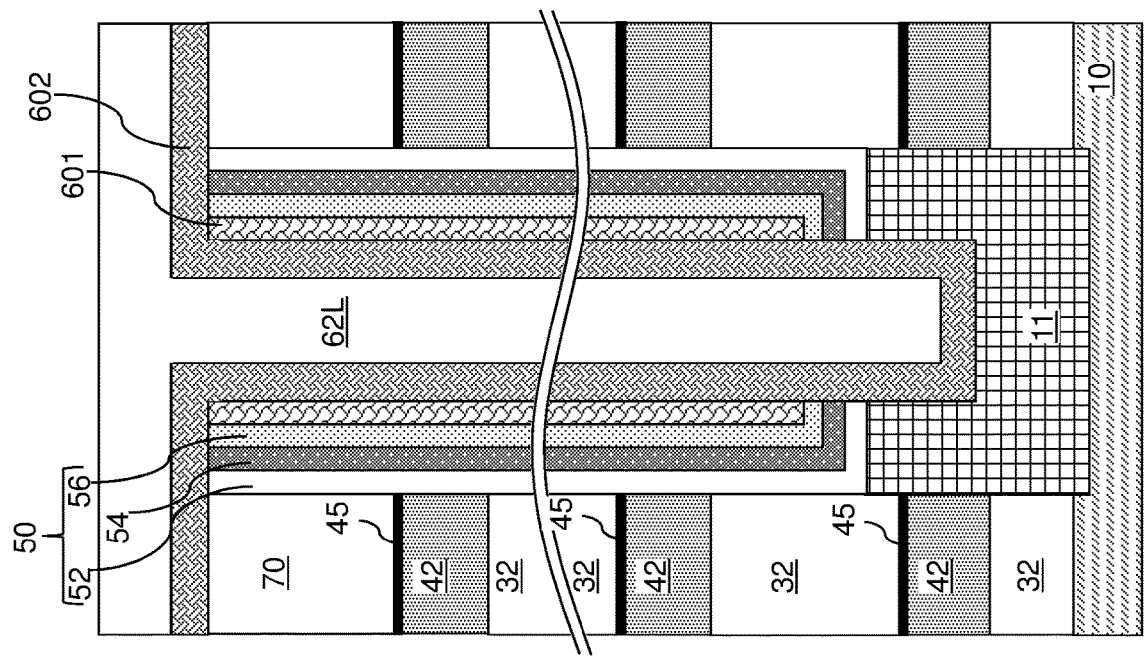
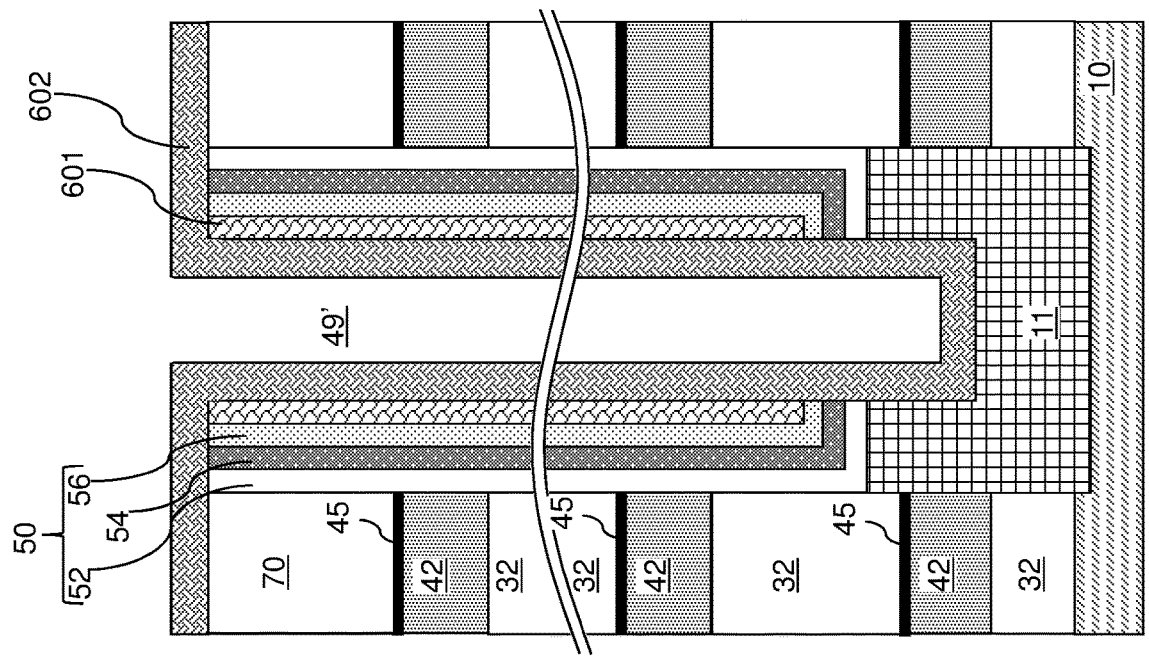

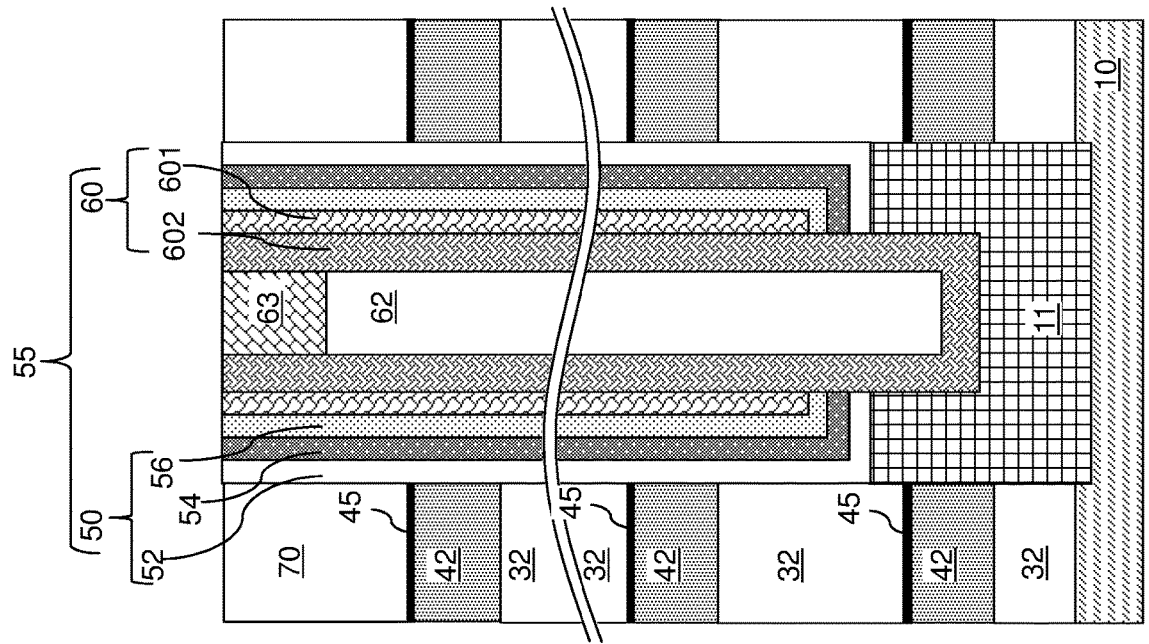
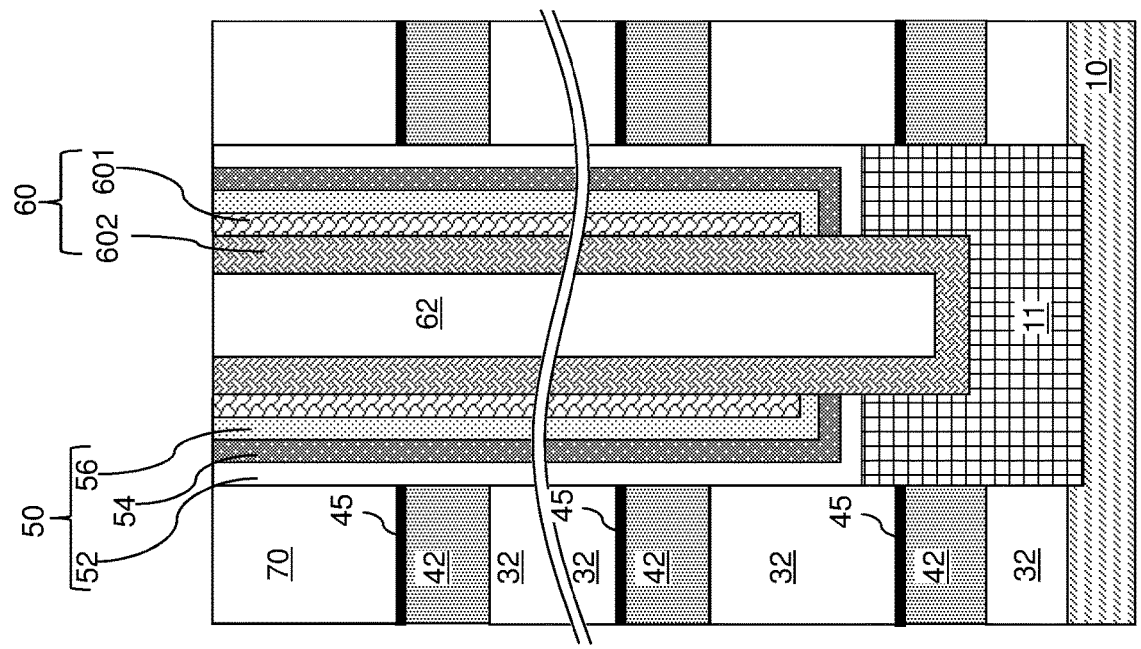
FIG. 5H
FIG. 5G

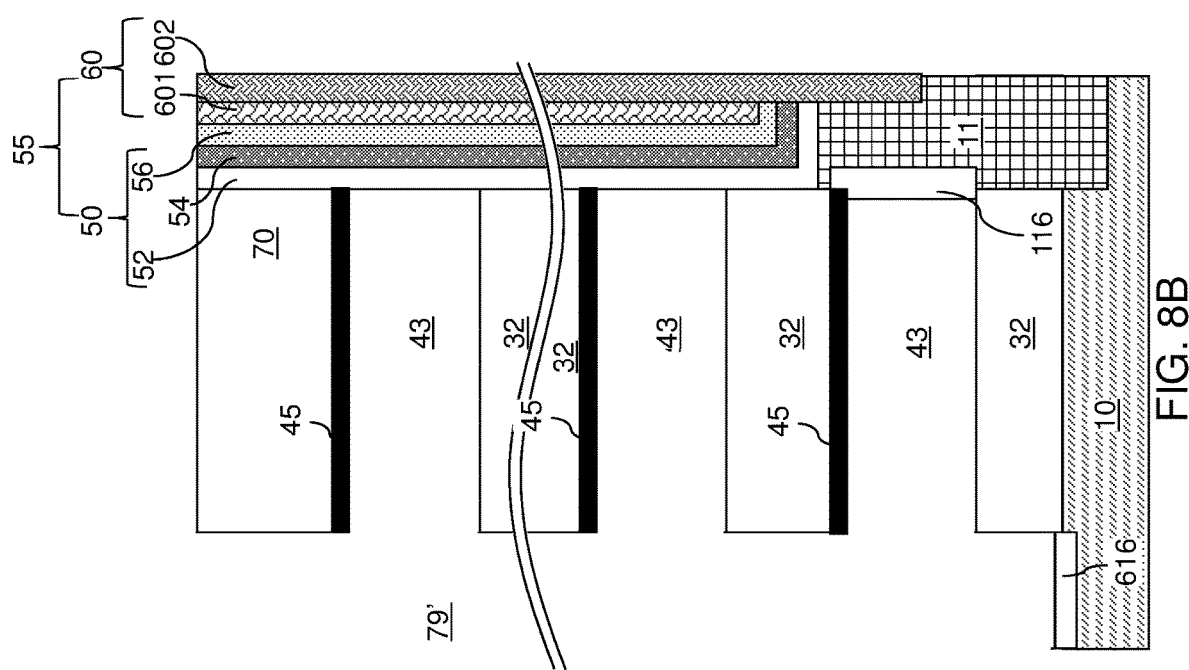

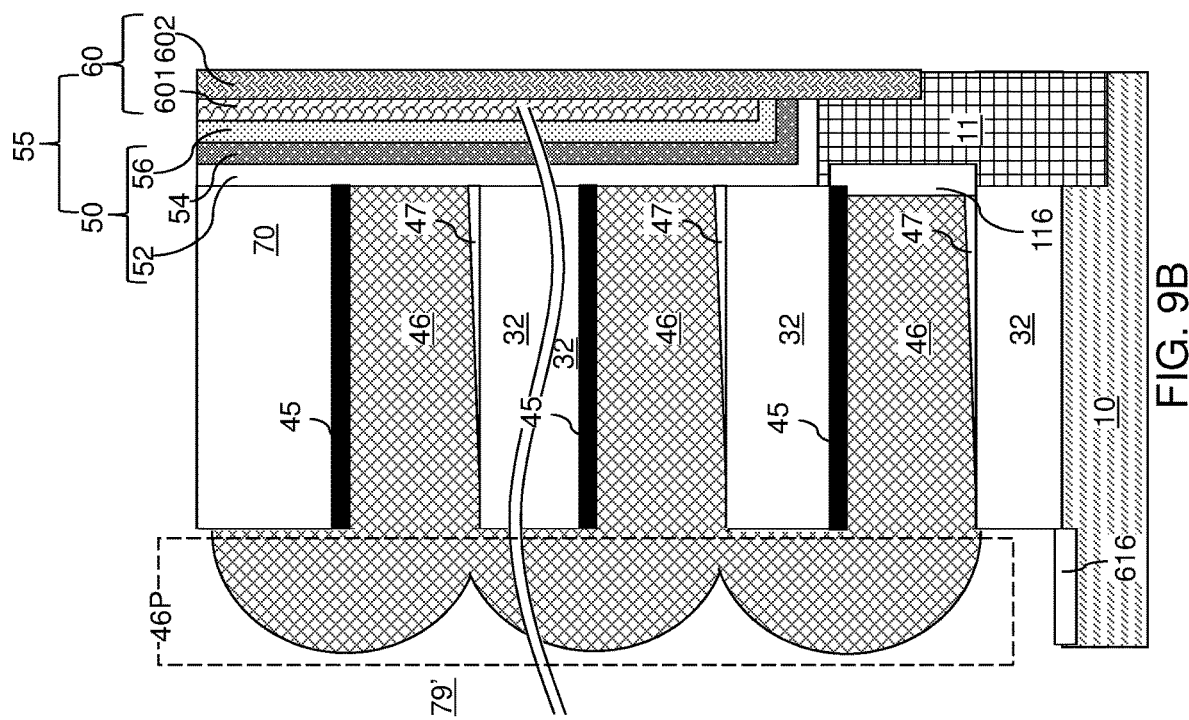

THREE-DIMENSIONAL MULTILEVEL DEVICE CONTAINING SEAMLESS UNIDIRECTIONAL METAL LAYER FILL AND METHOD OF MAKING SAME

FIELD

The present disclosure relates generally to the field of semiconductor devices, and particular to a three-dimensional memory device having electrically conductive layers formed by seamless unidirectional metal layer fill process and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a vertical repetition of a unit layer stack including an insulating layer, an electrically conductive layer, and a nucleation promoter layer located over a substrate; and memory stack structures extending through the vertical repetition, wherein each of the memory stack structures comprises a memory film and a vertical semiconductor channel.

According to another aspect of the present disclosure, a method of forming a three-dimensional memory device is provided, which comprises: forming a vertical repetition of a unit layer stack including an insulating layer, a sacrificial material layer, and a nucleation promoter layer over a substrate; forming memory stack structures through the vertical repetition, wherein each of the memory stack structures comprises a memory film and a vertical semiconductor channel; forming backside recesses by removing the sacrificial material layers selective to the insulating layers and the nucleation promoter layers within the vertical repetition; and forming electrically conductive layers in the backside recesses by selectively growing a metallic material from physically exposed surfaces of the nucleation promoter layers while suppressing growth of the metallic material from physically exposed surfaces of the insulating layers.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 8B is a magnified view of a region of the exemplary structure of FIG. 8A.

FIG. 9B is a magnified view of a region of the exemplary structure of FIG. 9A.

DETAILED DESCRIPTION

Figure 1:
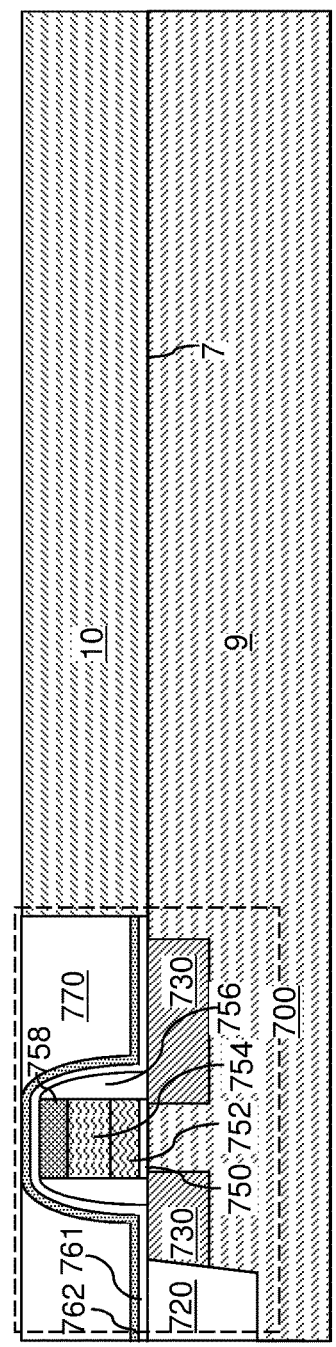
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a three-dimensional memory device having electrically conductive layers formed by seamless unidirectional metal layer fill and methods of manufacturing the same, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various embodiments of three-dimensional memory devices of the present disclosure include a monolithic three-dimensional NAND string memory device that can be fabricated using the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
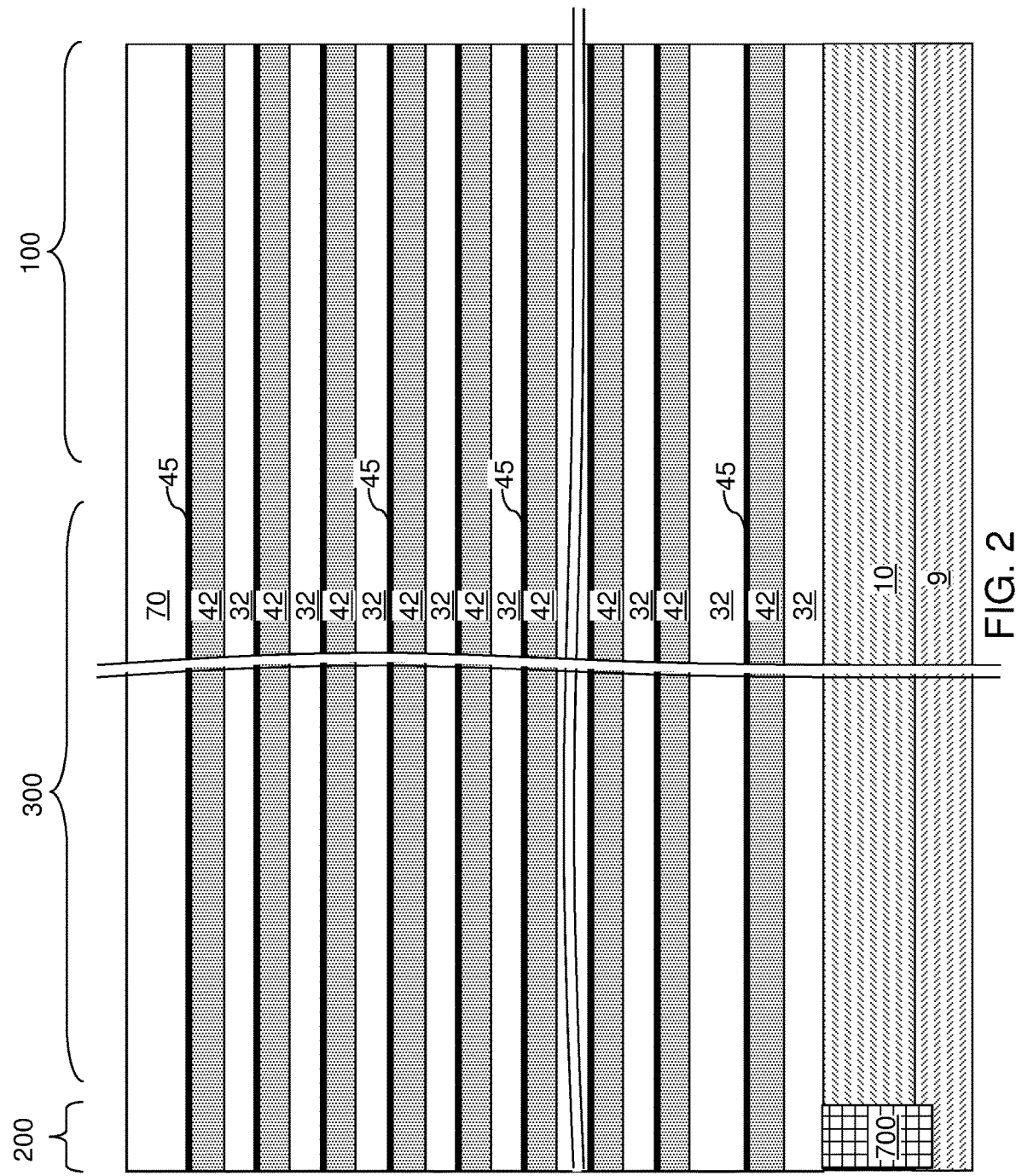
FIG. 2 is a schematic vertical cross-sectional view of the exemplary structure after formation of a vertical repetition of a unit layer stack including an insulating layer, a sacrificial material layer, and a nucleation promoter layer according to an embodiment of the present disclosure.

Referring to FIG. 2, a vertical repetition of a unit layer stack including an insulating layer 32, a sacrificial material layer 42, and a nucleation promoter layer 45 can be formed over the top surface of the substrate (9, 10). As used herein, a "vertical repetition" of a set of elements refers to a structure in which multiple sets, each including a respective instance of the elements, is repeated in a vertical direction. The order of elements along the vertical direction is the same within each set of elements in the vertical repetition. As used herein, a "nucleation promoter" refers to a material on which a selective deposition process of a metallic material can proceed to deposit the metallic material thereupon while the metallic material is not deposited on insulating surfaces. A nucleation promoter may include a metallic material or a non-metallic material (e.g., an electrically conductive material, such as a metal, a semiconductor material or an electrically insulating material). As used herein, a "nucleation promoter layer" refers to a layer of a nucleation promoter.

Each insulating layer 32 includes, and/or consists essentially of, an insulating material. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the insulating layers 32 can be silicon oxide. The insulating layers 32 can be deposited, for example, by chemical vapor deposition (CVD). For example, if silicon oxide is used for the insulating layers 32, tetraethyl orthosilicate (TEOS) can be used as the precursor material for the CVD process. The thickness of each insulating layer 32 can be in a range from 15 nm to 60 nm, although lesser and greater thicknesses can also be used. In one embodiment, all of the insulating layers 32 can have the same thickness.

Within each unit layer stack, a sacrificial material layer 42 may be located directly on an insulating layer of the unit layer stack, or a nucleation promoter layer 45 may be located directly on the insulating layer of the unit layer stack. In case an insulating layer 32 is the bottommost layer of each unit layer stack, each unit layer stack may include, from bottom to top, a sequence of the insulating layer 32, the sacrificial material layer 42, and the nucleation promoter layer 45, or a sequence of the insulating layer 32, the nucleation promoter layer 45, and the sacrificial material layer 42.

The sacrificial material layers 42 include a sacrificial material that can be removed selective to the material of the insulating layers 32 and the material of the nucleation promoter layer 45. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The material of the sacrificial material layers 42 can be subsequently replaced with electrically conductive electrodes which can function, for example, as control gate electrodes of a vertical NAND device. Non-limiting examples of the sacrificial material that can be used for the sacrificial material layers 42 include silicon nitride and a semiconductor material (such as amorphous silicon, polysilicon, and a silicon-germanium alloy). In one embodiment, the insulating layers 32 can include silicon oxide, and sacrificial material layers 42 can include silicon nitride. The sacrificial material layers 42 can be formed, for example, by chemical vapor deposition (CVD) or atomic layer deposition (ALD). The thickness of each sacrificial material layer 42 can be in a range from 15 nm to 60 nm, although lesser and greater thicknesses can also be used. In one embodiment, all of the sacrificial material layers 42 can have the same thickness.

The nucleation promoter layers 45 include a metallic or non-metallic material that can function as a nucleation layer during a selective metallic material deposition that is subsequently performed after removal of the sacrificial material layers 42. The nucleation promoter layers 45 have a different composition than the sacrificial material layers.

In one embodiment, the nucleation promoter layers 45 can comprise, and/or consist essentially of, a metallic element-containing material. The metallic element-containing material may include an elemental metal, a metal silicide, a conductive metallic nitride, or a conductive metal oxide. For example, the metallic element containing material can include W, Ti, Ta, Co, Ru, Mo, tungsten silicide, titanium silicide, tantalum silicide, titanium silicon nitride, tungsten carbon nitride, titanium oxide, tantalum nitride, tungsten nitride, or combinations thereof (such as an alloy or a multilayer stack).

In another embodiment, the nucleation promoter layers 45 can comprise, and/or consist essentially of, a non-metallic material that is substantially free of any metallic element. The non-metallic material can comprise silicon, germanium, a silicon-germanium alloy, boron, or combinations thereof (such as an alloy or a multilayer stack).

The nucleation promoter layers 45 can be formed, for example, by chemical vapor deposition (CVD) or atomic layer deposition (ALD). The thickness of each nucleation promoter layer 45 can be in a range from 1 nm to 15 nm, such as from 2 nm to 6 nm, although lesser and greater thicknesses can also be used. In one embodiment, all of the nucleation promoter layers 45 can have the same thickness. In one embodiment, the thickness of each nucleation promoter layer 45 can be less than 25%, such as less than 15%, of the thickness of the sacrificial material layer 42 within each unit layer stack.

Each nucleation promoter layer 45 within the vertical repetition is in direct contact with a respective one of the insulating layers 32 within the vertical repetition and in direct contact with a respective one of the sacrificial material layers 42 within the vertical repetition. In one embodiment, each nucleation promoter layer 45 within the vertical repetition is in direct contact with a bottom surface of the respective one of the insulating layers 32 within the vertical repetition. In one embodiment, each nucleation promoter layer 45 within the vertical repetition is in direct contact with a top surface of the respective one of the insulating layers 32 within the vertical repetition.

In one embodiment, the unit layer stack consists of an insulating layer 32, the sacrificial material layer 42, and a nucleation promoter layer 45. In one embodiment, each unit layer stack other than a topmost one or a bottommost one of the unit layer stacks within the vertical repetition is in direct contact with a respective overlying one of the unit layer stacks and in direct contact with a respective underlying one of the unit layer stacks.

Optionally, an insulating cap layer 70 can be formed over the vertical repetition (32, 42, 45). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
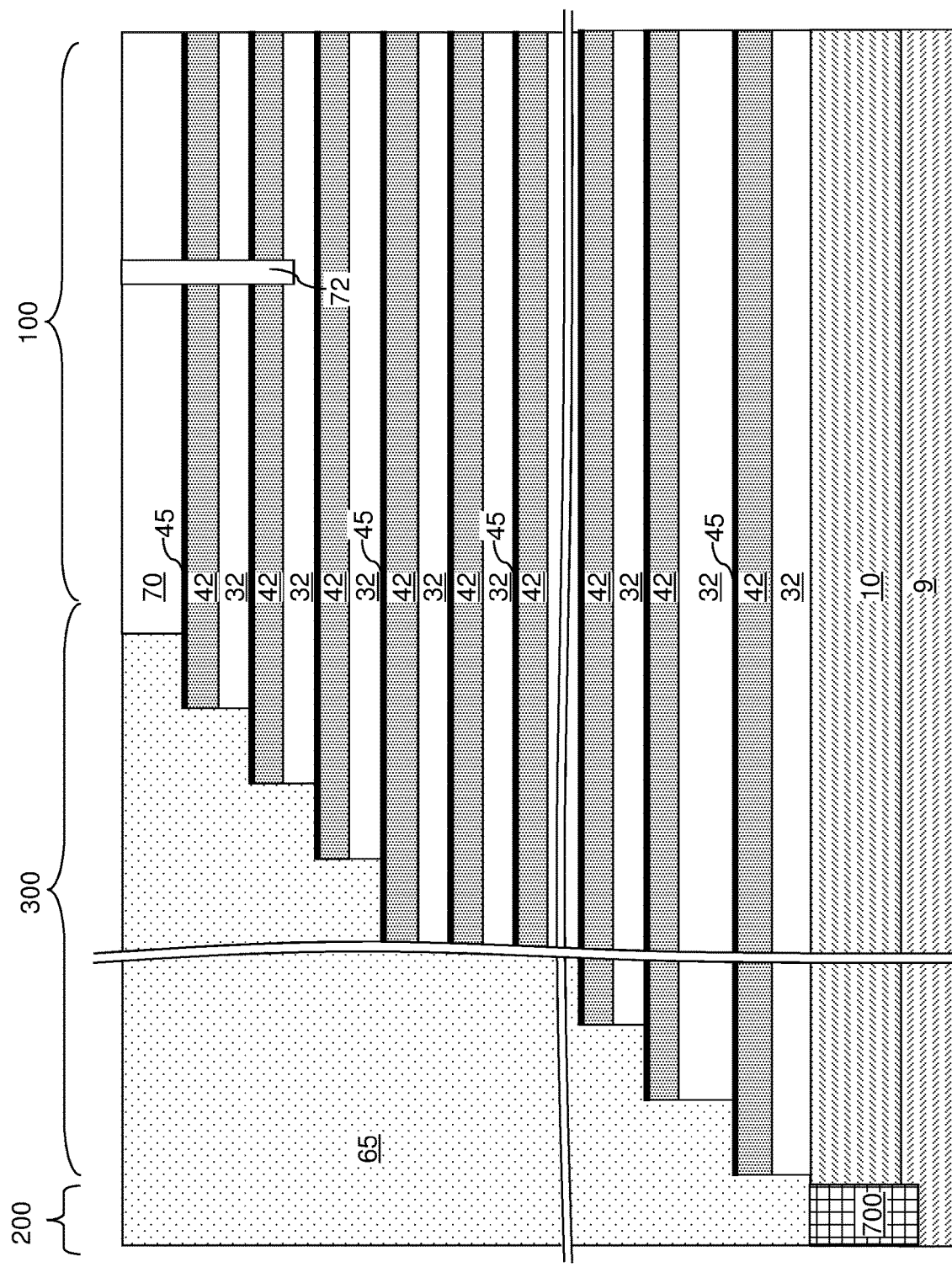
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the vertical repetition (32, 42, 45), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32, 42, 45) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of an element is defined as a volume defined between a first horizontal plane including a topmost surface of the element and a second horizontal plane including a bottommost surface of the element.

Each sacrificial material layer 42 other than a topmost sacrificial material layer 42 within the vertical repetition (32, 42, 45) laterally extends farther than any overlying sacrificial material layer 42 within the vertical repetition (32, 42, 45) in the terrace region. The terrace region includes stepped surfaces of the vertical repetition (32, 42, 45) that continuously extend from a bottommost layer within the vertical repetition (32, 42, 45) to a topmost layer within the vertical repetition (32, 42, 45).

Each vertical step of the stepped surfaces can have the height of one or more pairs of an insulating layer 32 and a sacrificial material layer. In one embodiment, each vertical step can have the height of a single unit layer stack. In another embodiment, multiple "columns" of staircases can be formed along a first horizontal direction such that each vertical step has the height of a plurality of unit layer stacks. Each column of staircase can be vertically offset among one another such that each topmost layer of the unit layer stacks (which may be nucleation promoter layers 45, the sacrificial material layers 42, or the insulating layers 32) has a physically exposed top surface in a respective column of staircases. In the illustrative example, two columns of staircases are formed for each block of memory stack structures to be subsequently formed such that one column of staircases provide physically exposed top surfaces for odd-numbered nucleation promoter layers 45 (as counted from the bottom) and another column of staircases provide physically exposed top surfaces for even-numbered nucleation promoter layers 45 (as counted from the bottom). Configurations using three, four, or more columns of staircases with a respective set of vertical offsets among the physically exposed surfaces of unit layer stacks may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction, and the columns of staircases may be arranged along a second horizontal direction that is perpendicular to the first horizontal direction. In one embodiment, the first horizontal direction may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above a horizontal plane including the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
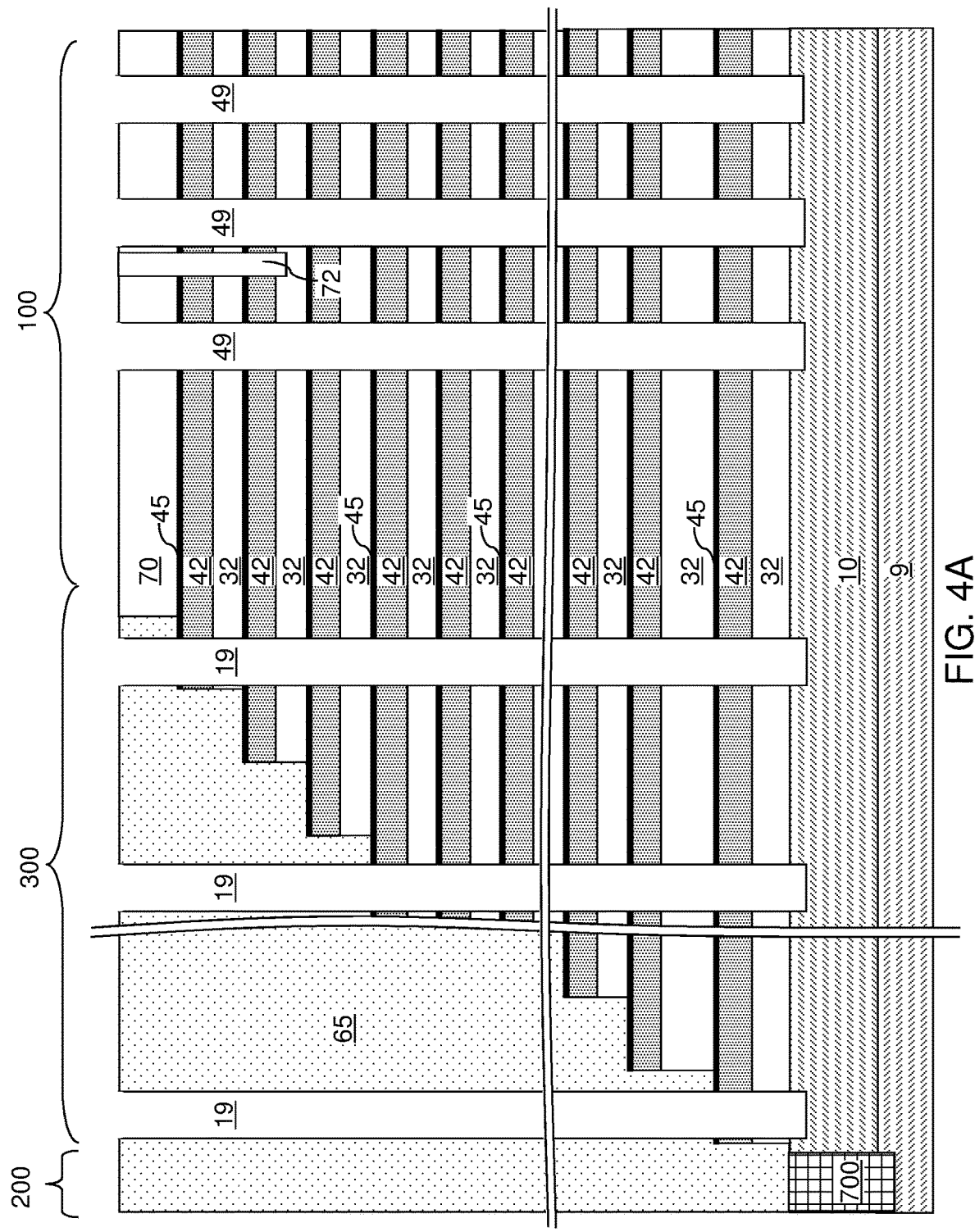
FIG. 4A is a schematic vertical cross-sectional view of the exemplary structure after formation of memory openings and support openings according to an embodiment of the present disclosure.
Figure 4B:
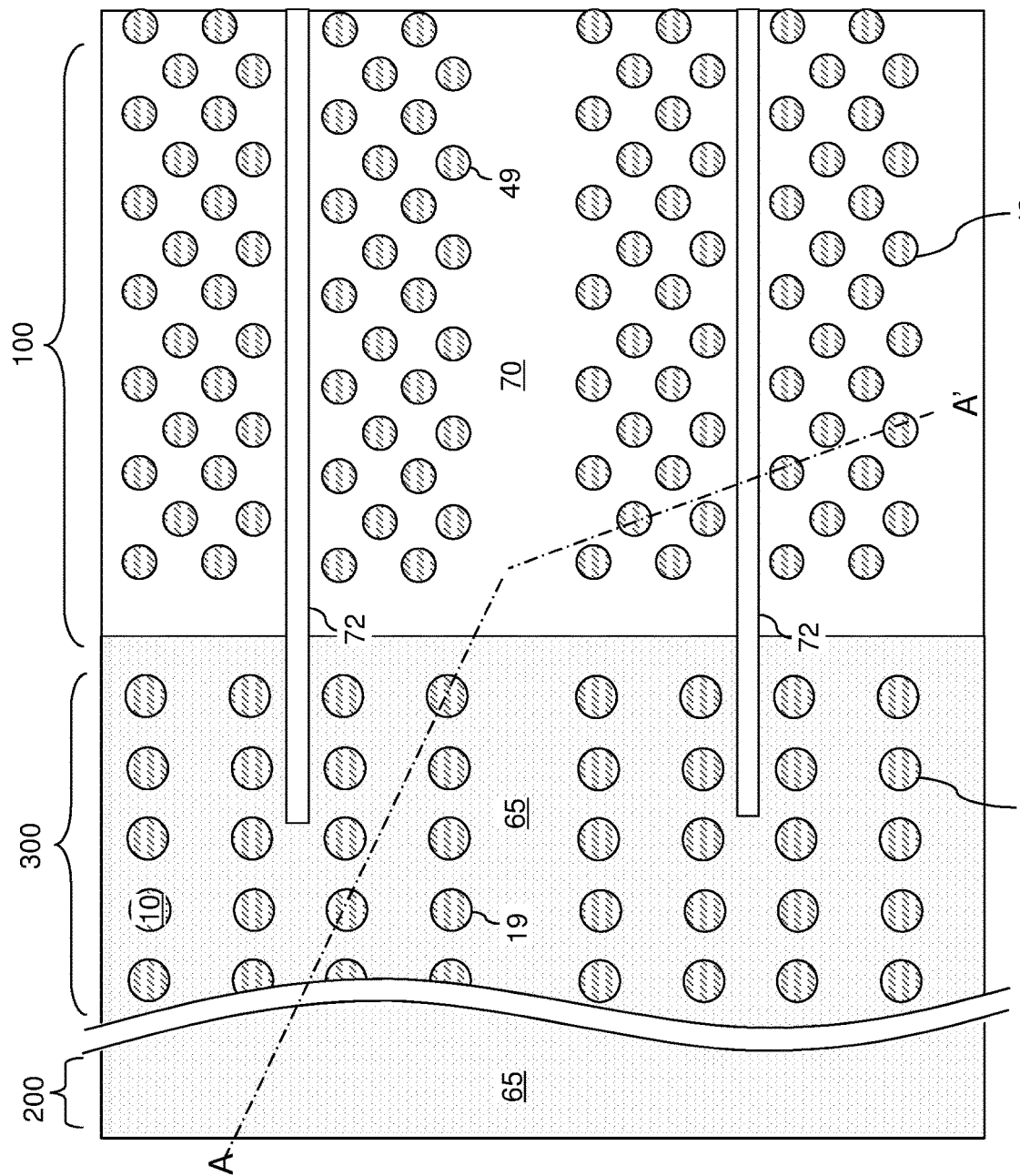
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical repetition (32, 42, 45) by at least one anisotropic etch that uses the patterned lithographic material stack as an etch mask. Portions of the vertical repetition (32, 42, 45) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical repetition (32, 42, 45) in the memory array region 100. The support openings 19 are formed through the retro-stepped dielectric material portion 65 and the portion of the vertical repetition (32, 42, 45) that underlie the stepped surfaces in the contact region 300.

The memory openings 49 extend through the entirety of the vertical repetition (32, 42, 45). The support openings 19 extend through a subset of layers within the vertical repetition (32, 42, 45). The chemistry of the anisotropic etch process used to etch through the materials of the vertical repetition (32, 42, 45) can alternate to optimize etching of the first and second materials in the vertical repetition (32, 42, 45). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32, 42, 45) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the vertical repetition (32, 42, 45), and optionally into an upper portion of the semiconductor material layer 10. At this processing step, each support opening 19 can extend through the retro-stepped dielectric material portion 65, a subset of layers in the vertical repetition (32, 42, 45), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of the bottommost sacrificial material layer 42. In this case, a source select gate electrode can be subsequently formed by replacing the bottommost sacrificial material layer 42 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. In one embodiment, the blocking dielectric layer 52 can include a layer stack, from outside to inside, of a dielectric metal oxide layer (such as an aluminum oxide layer) and a silicon oxide layer.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
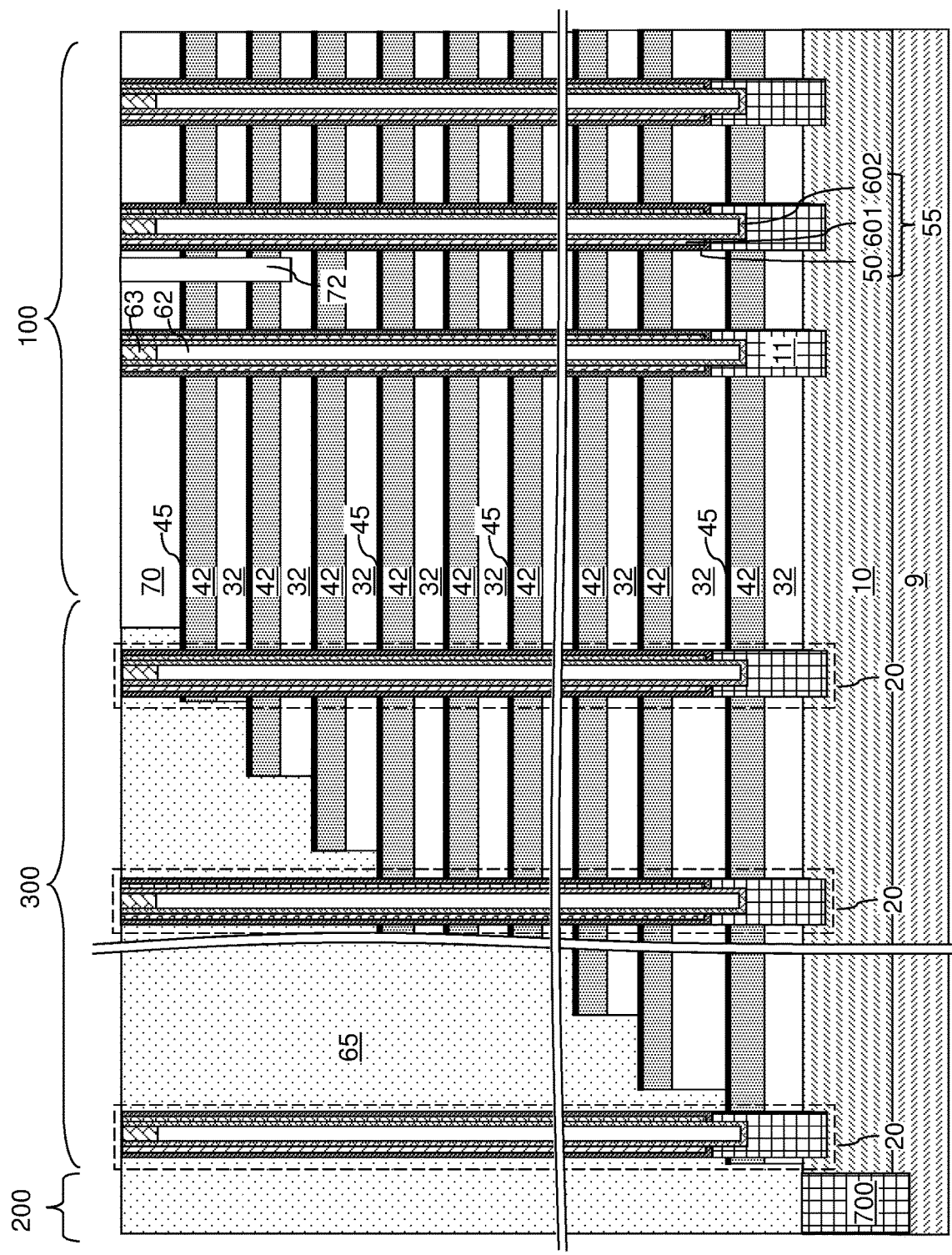
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described using the illustrated configuration for the memory stack structure, the methods of various embodiments can be applied to alternative memory stack structures including different layer stacks or structures for the memory film 50 and/or for the vertical semiconductor channel 60.

Each of the memory stack structures 55 is located within a respective memory opening 49 that extends through, and is laterally surrounded by, the vertical repetition (32, 42, 45) of the unit layer stack. In one embodiment, each memory film 50 within the memory stack structures 55 comprises a blocking dielectric 52 in direct contact with a plurality of insulating layers 32, a plurality of sacrificial material layers 42, and a plurality of nucleation promoter layers 45 within the vertical repetition (32, 42, 45) of the unit layer stack. Each memory film 50 within the memory stack structures 55 further comprises a charge storage layer 54 contacting the blocking dielectric 52, and a tunneling dielectric 56 contacting the charge storage layer 54 and contacting a respective one of the vertical semiconductor channels 60. The support pillar structures 20 extend through the stepped surfaces and through a retro-stepped dielectric material portion 65 that overlies the stepped surfaces.

Figure 7A:
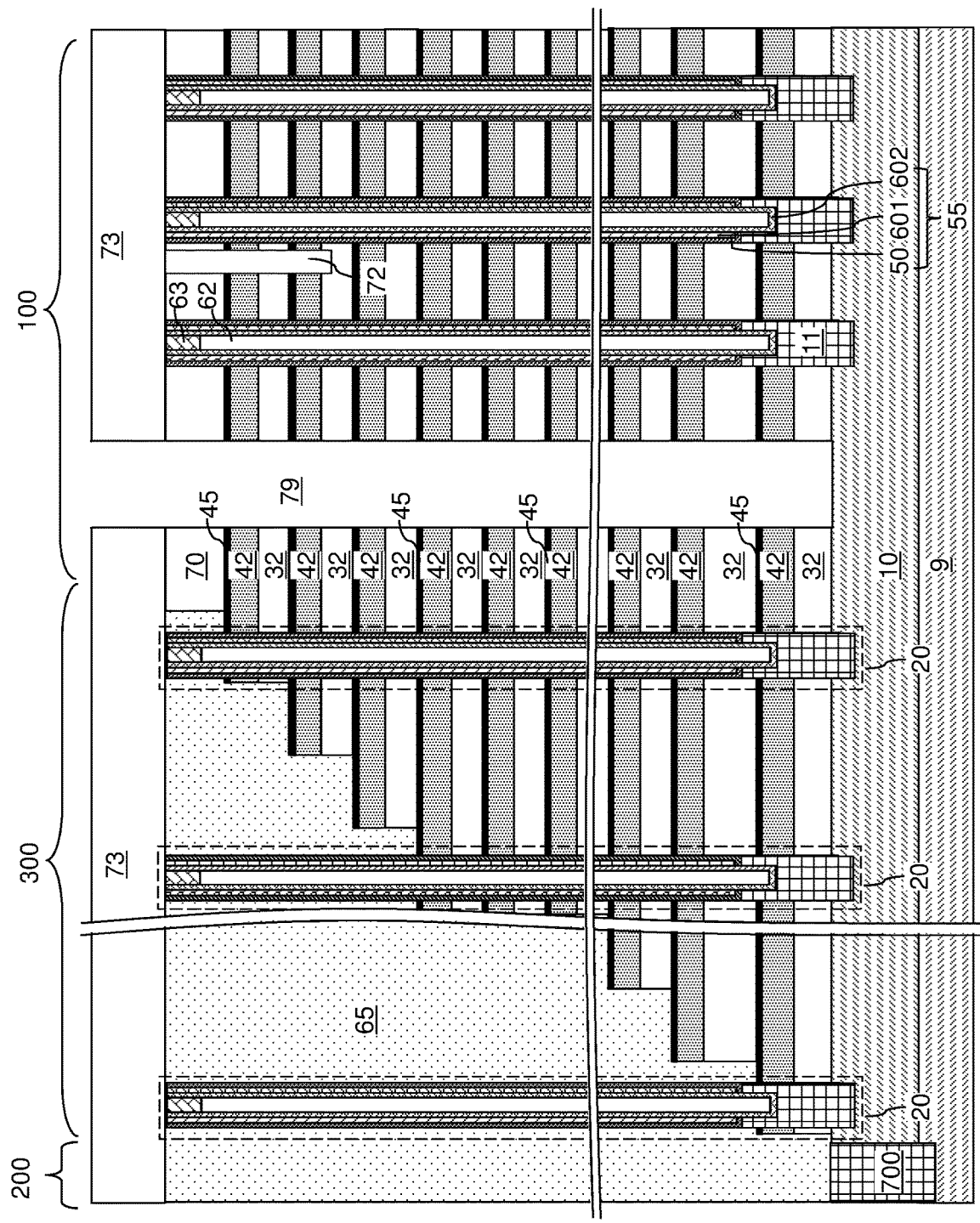
FIG. 7A is a schematic vertical cross-sectional view of the exemplary structure after formation of backside trenches according to an embodiment of the present disclosure.
Figure 7B:
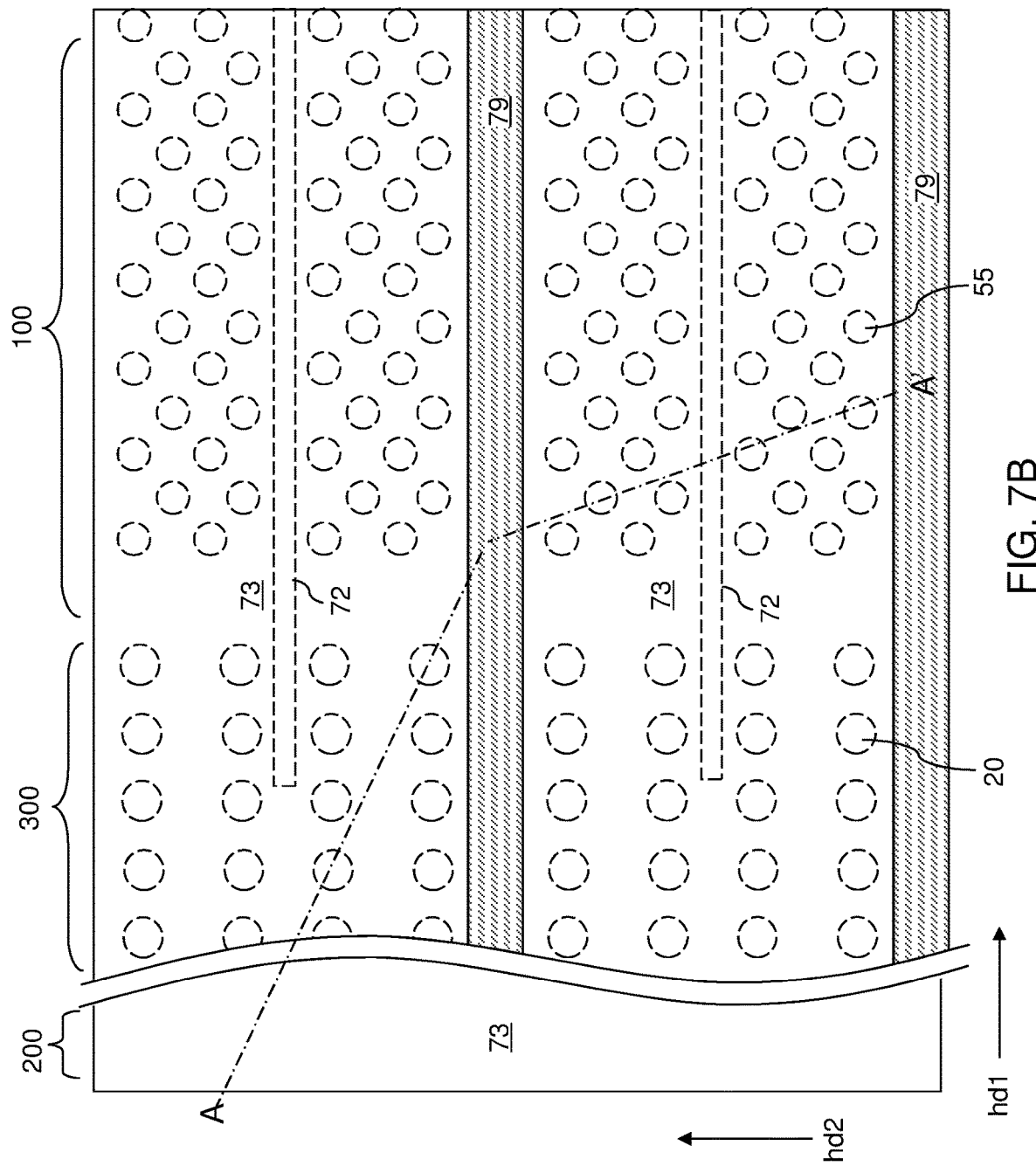
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the vertical repetition (32, 42, 45) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the vertical repetition (32, 42, 45) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can extend laterally along a first horizontal direction hd1 and can be laterally spaced apart from one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8A:
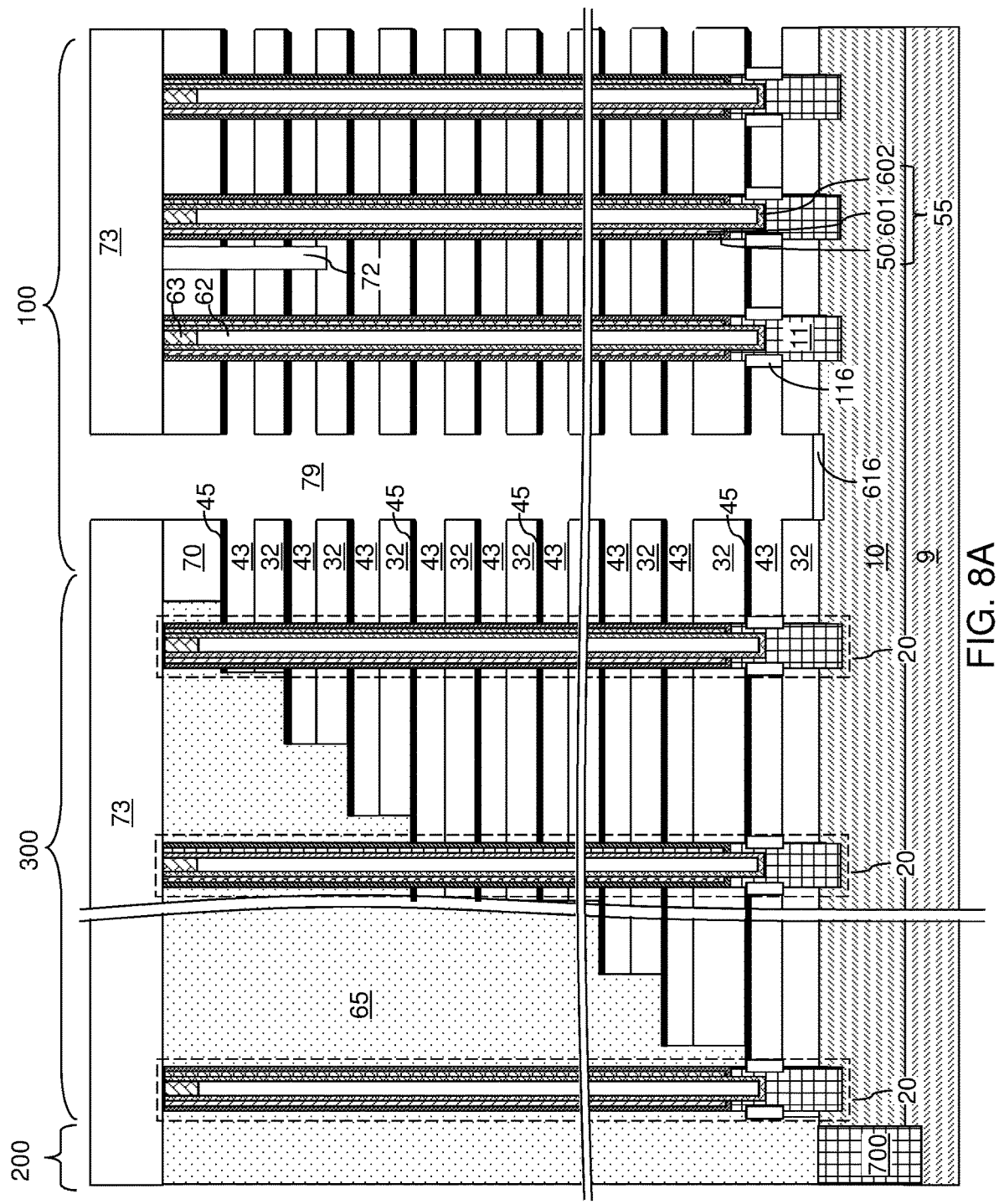
FIG. 8A is a schematic vertical cross-sectional view of the exemplary structure after formation of backside recesses according to an embodiment of the present disclosure.
Figure 9A:
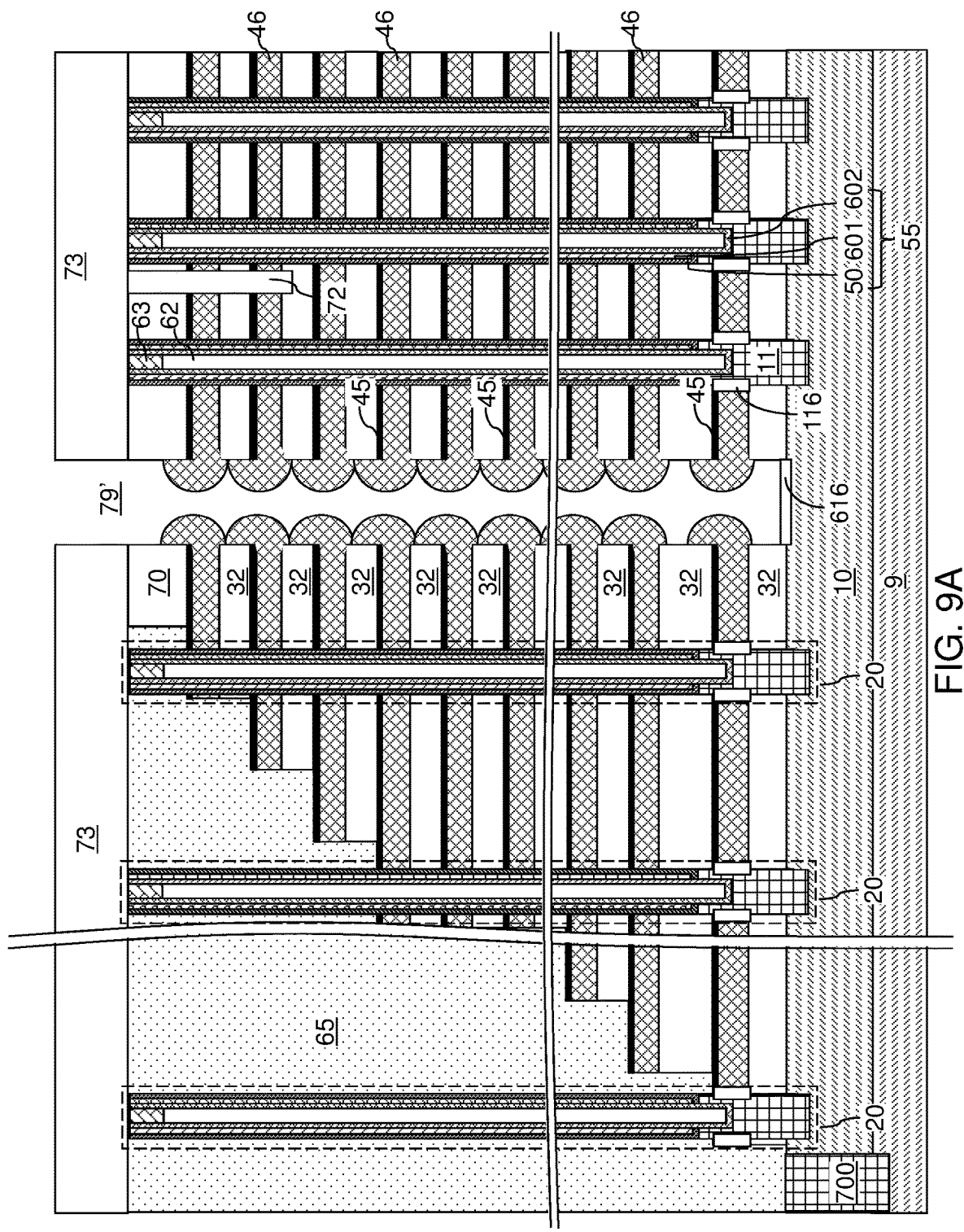
FIG. 9A is a schematic vertical cross-sectional view of the exemplary structure after formation of electrically conductive layers according to an embodiment of the present disclosure.

Referring to FIGS. 8A and 8B, an etchant that selectively etches the sacrificial material of the sacrificial material layers 42 with respect to the materials of the insulating layers 32 and the nucleation promoter layers 45 can be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the sacrificial material of the sacrificial material layers 42 can be selective to the material of the insulating layers 32, the material of the nucleation promoter layers 45, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the sacrificial material selective to the material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the sacrificial material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a horizontal surface of an insulating layer 32 and a horizontal surface of a nucleation promoter layers 45. In one embodiment, a backside recess 43 can be vertically bounded by a bottom horizontal surface of an overlying insulating layer 32 and a top horizontal surface of an underlying nucleation promoter layers 45. In another embodiment, a backside recess 43 can be vertically bounded by a top horizontal surface of an underlying insulating layer 32 and a bottom horizontal surface of an overlying nucleation promoter layers 45. In one embodiment, each backside recess 43 can have a uniform height throughout.

In case pedestal channel portions 11 are used, physically exposed surface portions of the pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. In case the pedestal channel portions 11 are not used, processing steps for formation of the tubular dielectric spacers 116 and the planar dielectric portions 616 can be omitted.

Referring to FIGS. 9A and 9B, a metal fill material is deposited on the physically exposed surfaces of the nucleation promoter layers 45 by a selective metal deposition process. The selective metal deposition process uses a metal precursor gas that is decomposed only on metallic surfaces and does not decompose on dielectric surfaces. The selective metal deposition process selectively grows a metallic material from physically exposed surfaces of the nucleation promoter layers 45 while suppressing growth of the metallic material from physically exposed surfaces of the insulating layers 32. In the selective metal deposition process, metallic surfaces induce surface decomposition of the metal precursor gas and function as nucleation sites for a decomposition product from the metal precursor gas. The dielectric surfaces (such as the surfaces of the insulating layers 32) do not induce surface decomposition of the metal precursor gas and thus, prevents nucleation of the decomposition product from the metal precursor gas. Thus, growth of the metal fill material proceeds only from the physically exposed surfaces of the nucleation promoter layers 45.

The selective metal deposition process can use an atomic layer deposition (ALD) process or a chemical vapor deposition (CVD) process. The metal fill material can consist essentially of an elemental metal, or may include a combination of a nucleation material portion including an alloy of the elemental metal and a dopant element and a bulk metal fill material portion consisting essentially of the elemental metal. In one embodiment, the metal fill material can consist essentially of at least one metal selected from tungsten, ruthenium, cobalt, and molybdenum. In one embodiment, the entirety of the metal fill material can consist essentially of a single elemental metal selected from tungsten, ruthenium, cobalt, and molybdenum. In another embodiment, the metal fill material can include a nucleation material portion including silicon or boron as a dopant element in addition to an elemental metal and formed directly on a surface of a nucleation promoter layer 45, and can further include a bulk metal fill material portion consisting essentially of the elemental metal and formed on the nucleation material portion. For example, the nucleation material portion can include tungsten doped with silicon or boron, and the bulk metal fill material portion can consist essentially of tungsten.

In a non-limiting illustrative example, silicon can be employed for the nucleation promoter layers 45. In this case, silicon can directly initiate nucleation of chemical vapor deposition (CVD) or atomic layer deposition (ALD) of W (using $WF_6$ and $H_2$ as a metallic precursor gas and a reducing gas). About 3 nm of silicon is converted into a tungsten material portion during a nucleation process. Thus, if a silicon layer having a thickness greater than 4 nm is employed for each nucleation promoter layer 45, a residual silicon layer can be present after deposition of tungsten material portions. Generally, the thickness of each nucleation promoter layer 45 can be selected such that a thin remnant portion of each nucleation promoter layer 45 continuously extends between an insulating layer 32 and each conductive material portion that includes the deposited metallic material. If a silicon layer having a thickness less than 3 nm is employed for each nucleation promoter layer 45, the entirety of the nucleation promoter layers 45 can be consumed during nucleation, and each conductive material portion can directly contact at least one insulating layer 32. Alternatively, instead of tungsten, ruthenium can nucleate on silicon by using a ruthenium-containing precursor gas.

In an alternative embodiment, the amount of the consumed material (such as silicon) from the nucleation promoter layers 45 can be increased by exposing the nucleation promoter layers 45 to a metal-containing precursor gas at an elevated temperature. For example, if silicon is employed for the nucleation promoter layers 45 and if tungsten is to be deposited in the backside recesses 43, then silicon in the nucleation promoter layers 45 may be completely consumed by exposing the nucleation promoter layers 45 to $WCl_5$, $WCl_6$, or $WF_6$ at an elevated temperature in a range from 400 degrees Celsius to 600 degrees Celsius for a duration in a range from 1 second to 30 seconds. The silicon layers of the nucleation promoter layers 45 can be converted into thin tungsten nucleation layers, and additional tungsten can be deposited on the thin tungsten nucleation layers employing any conformal tungsten deposition process.

In another illustrative example, boron can be employed for the nucleation promoter layers 45. In this case, the nucleation promoter layers 45 can be formed by thermal decomposition of $B_2H_6$ on a deposition surface at an elevated temperature in a range from 250 degrees Celsius to 350 degrees Celsius. The boron layers employed as the nucleation promoter layers 45 can directly nucleate tungsten or other metals.

The selectively deposited metal fill material grows from the physically exposed surfaces of the nucleation promoter layers 45 substantially conformally and isotropically. Portions of the selectively deposited metal fill material located in the backside recesses 43 constitute electrically conductive layers 46. In one embodiment, each of the electrically conductive layers 46 comprises, and/or consists essentially of, at least one metal selected from tungsten, ruthenium, cobalt, and molybdenum. Portions of the selectively deposited metal fill material within the backside trenches constitute conductive material portions 46P.

In one embodiment, the selectively deposited metal fill material may grow with perfect conformity from the physically exposed surfaces of the nucleation promoter layers 45 within each backside recess 43 such that the entire volume of each backside recess 43 is completely filled with a respective one of the electrically conductive layers 46. More typically, the conformity of the selectively deposited metal fill material deposited in the selective metal deposition process is less than perfect, and the thickness of the selectively deposited metal fill material in the backside recesses 43 decreases with a horizontal distance from a most proximal one of the backside trenches 79. Because the sacrificial material layers 43 are formed as planar layers having a respective uniform thickness throughout, each of the backside recesses 43 has a respective uniform height. The laterally decreasing thickness of the selectively deposited metal fill material in the backside recesses 43 as a function of the lateral distance from the backside trenches 79 causes formation of variable-thickness voids 47 that have a respective variable thickness that increases with a lateral distance from a most proximal one of the backside trenches 79. The electrically conductive layers 46 can contact a respective one of the insulating layers 32 in proximity to a backside trench 79, and can be spaced from the respective one of the insulating layers 32 in proximity to a memory stack structure 55. In one embodiment, the variable-thickness voids 47 can contact respective portions of outer sidewalls of the memory stack structures 55 that are encircled by, and contacted by, the electrically conductive layers 46. In one embodiment, the variable-thickness voids 47 can contact portions of blocking dielectrics 52 and tubular dielectric spacers 116 (if present).

Each conductive material portion 46P can include a plurality of convex surfaces. The total number of the convex surfaces for each conductive material portion 46P can be the same as the total number of the nucleation promoter layers 45 within a vertical repetition of a unit layer stack that includes an insulating layer 32, an electrically conductive layer 42, and a nucleation promoter layer 45. Each conducive material portion 46P can be adjoined to a set of electrically conductive layers 46 without any microstructural interface therebetween. In other words, each conductive material portion 46P and the second electrically conductive layers 46 can be formed as a single continuous structure.

A plurality of electrically conductive layers 46 can be formed in the plurality of backside recesses 43, and a conductive material portion 46P can be formed on each sidewall of the backside trenches 79. In one embodiment, each sacrificial material layer 42 can be replaced with an electrically conductive layer 46 and a variable-thickness void 47 (if present). A backside cavity 79' may be present in the portion of each backside trench 79 that is not filled with the conductive material portion 46P. A bottommost electrically conductive layer 46 laterally surrounds each tubular dielectric spacer 116 (if present) upon formation of the electrically conductive layers 46.

Each electrically conductive layer 46 of various embodiments grows vertically up to the height of a backside recess 43, which is the same as the thickness of a sacrificial material layer 42 that is removed to form the backside recess 43. A conventional method isotropically deposits a electrically conductive layer from all surfaces of a backside recess and thus, can have a maximum vertical growth distance of one half of the height of the backside recess. In contrast, the method of various embodiments provides a growth distance for the metallic fill material that can be about the height of a backside recess. Thus, the grains of metallic fill material of the electrically conductive layers 46 of various embodiments can be much larger than the grains of electrically conductive layers formed by isotropic deposition of a conductive material from all surfaces of a backside recess.

Figure 10A:
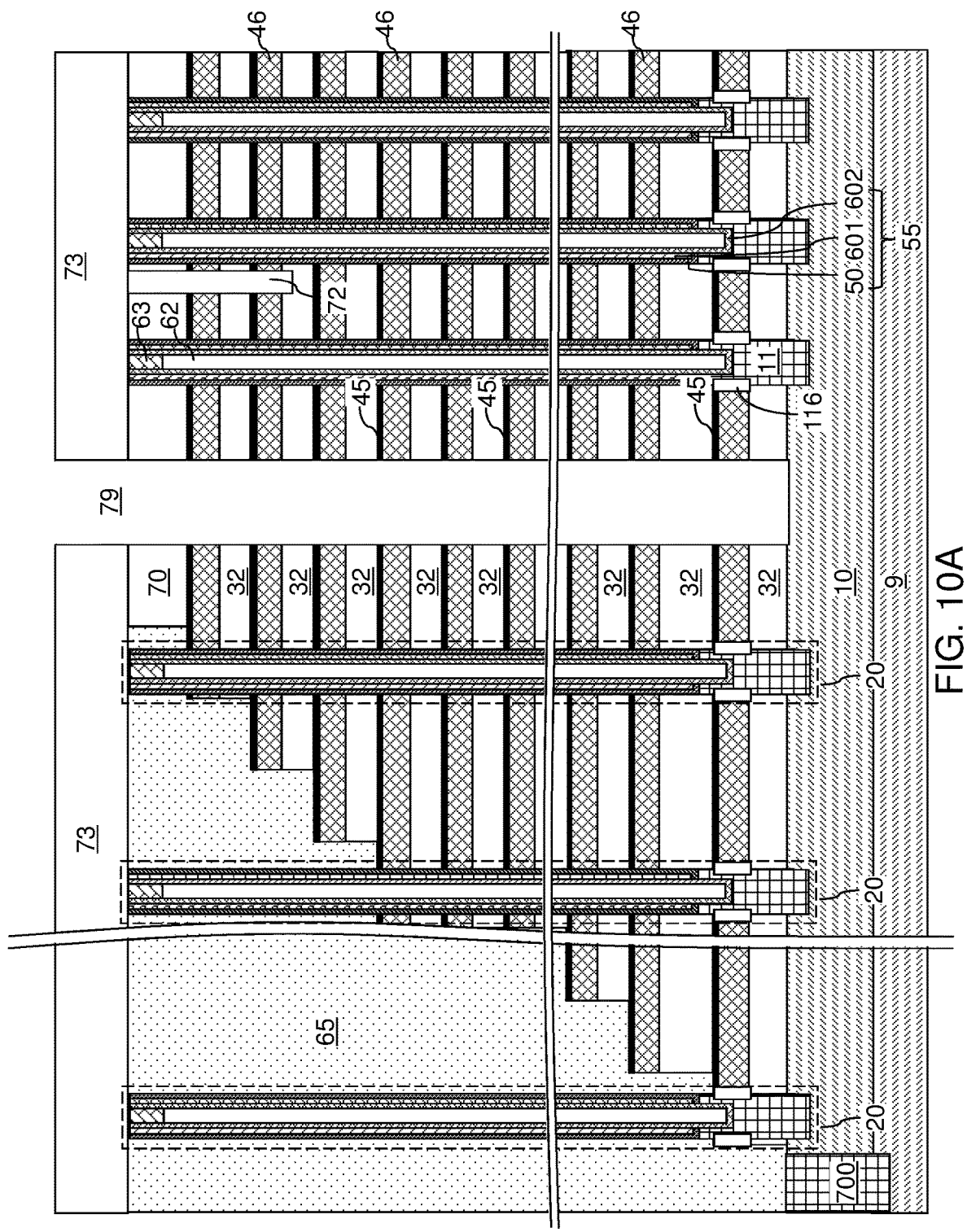
FIG. 10A is a schematic vertical cross-sectional view of the exemplary structure after removal of a deposited conductive material from within the backside trench according to an embodiment of the present disclosure.
Figure 10B:
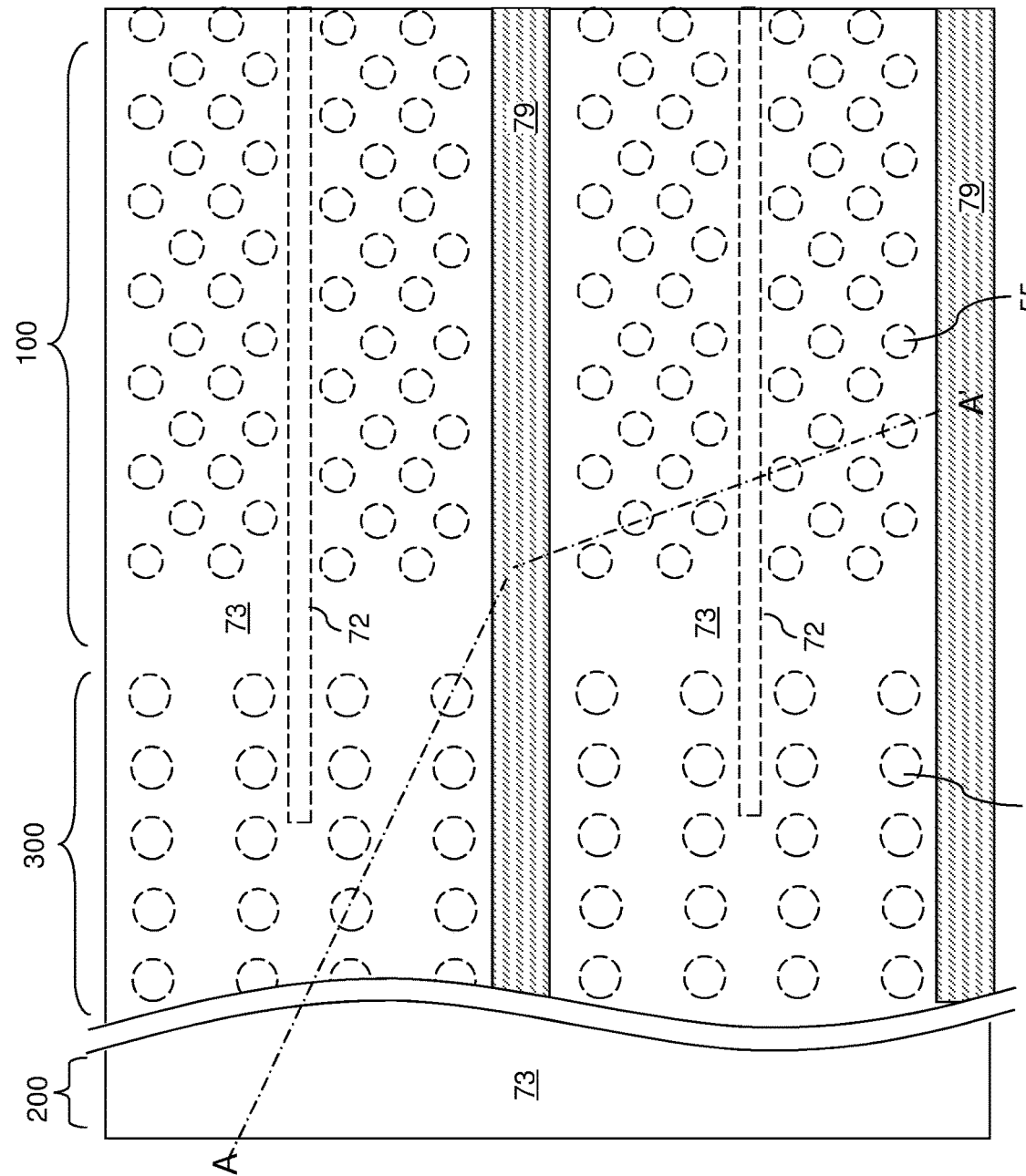
FIG. 10B is a top-down view of the exemplary structure of FIG. 10A. The vertical plane A-A' is the plane of the schematic vertical cross-sectional view of FIG. 10A.

Referring to FIG. 10, the deposited metallic material of the conductive material portions 46P is etched back from the sidewalls of each backside trench 79, for example, by an isotropic wet etch, an anisotropic dry etch, or a combination thereof. The electrically conductive layers 46 are disconnected from one another upon removal of the conductive material portions 46P. Each electrically conductive layer 46 can be a conductive line structure. Each electrically conductive layer 46 can function as a combination of a plurality of control gate electrodes located at a same level and a word line electrically interconnecting the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 11:
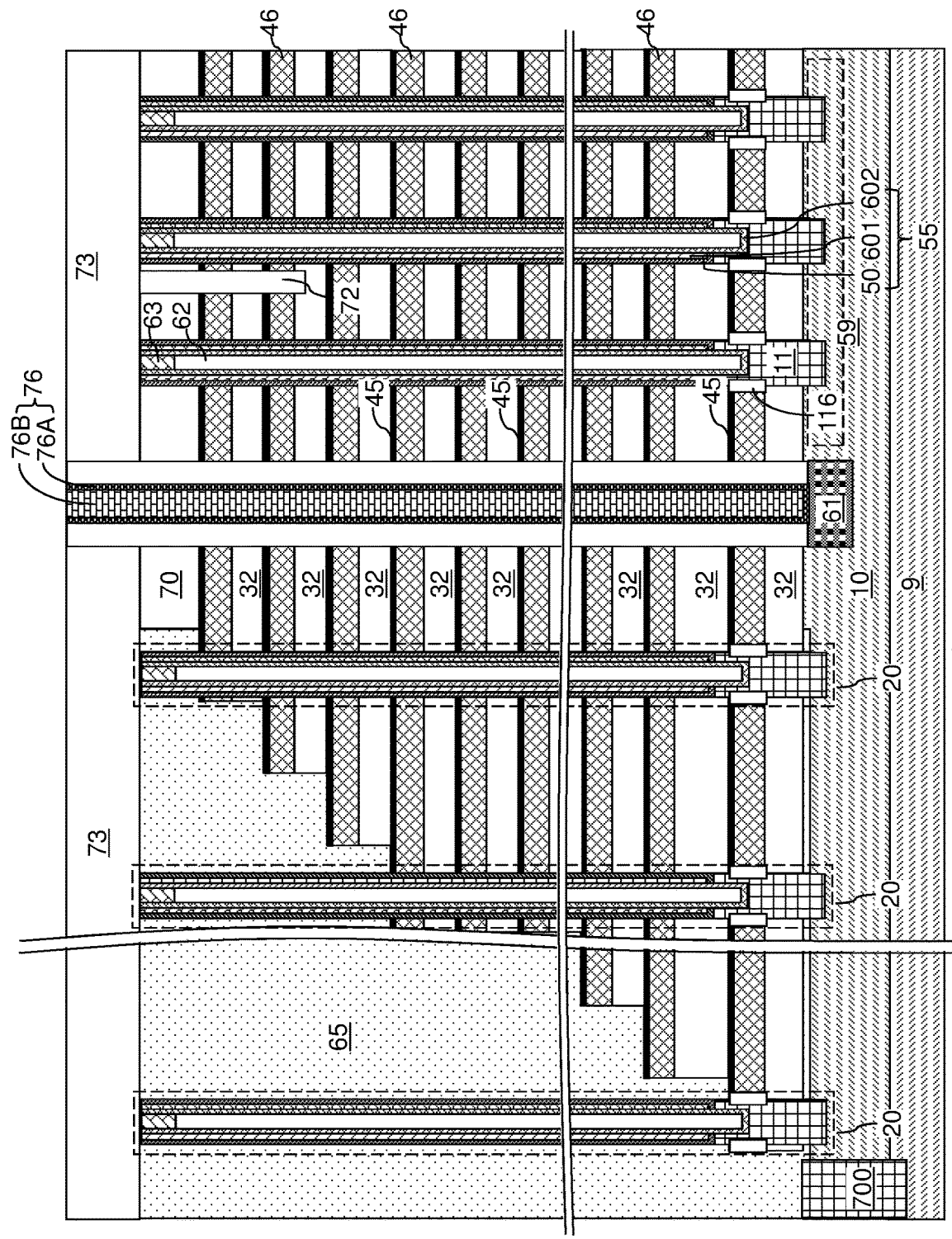
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the vertical repetition (32, 46, 45) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the vertical repetition (32, 46, 45) as a stopping layer. If a chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

Figure 12A:
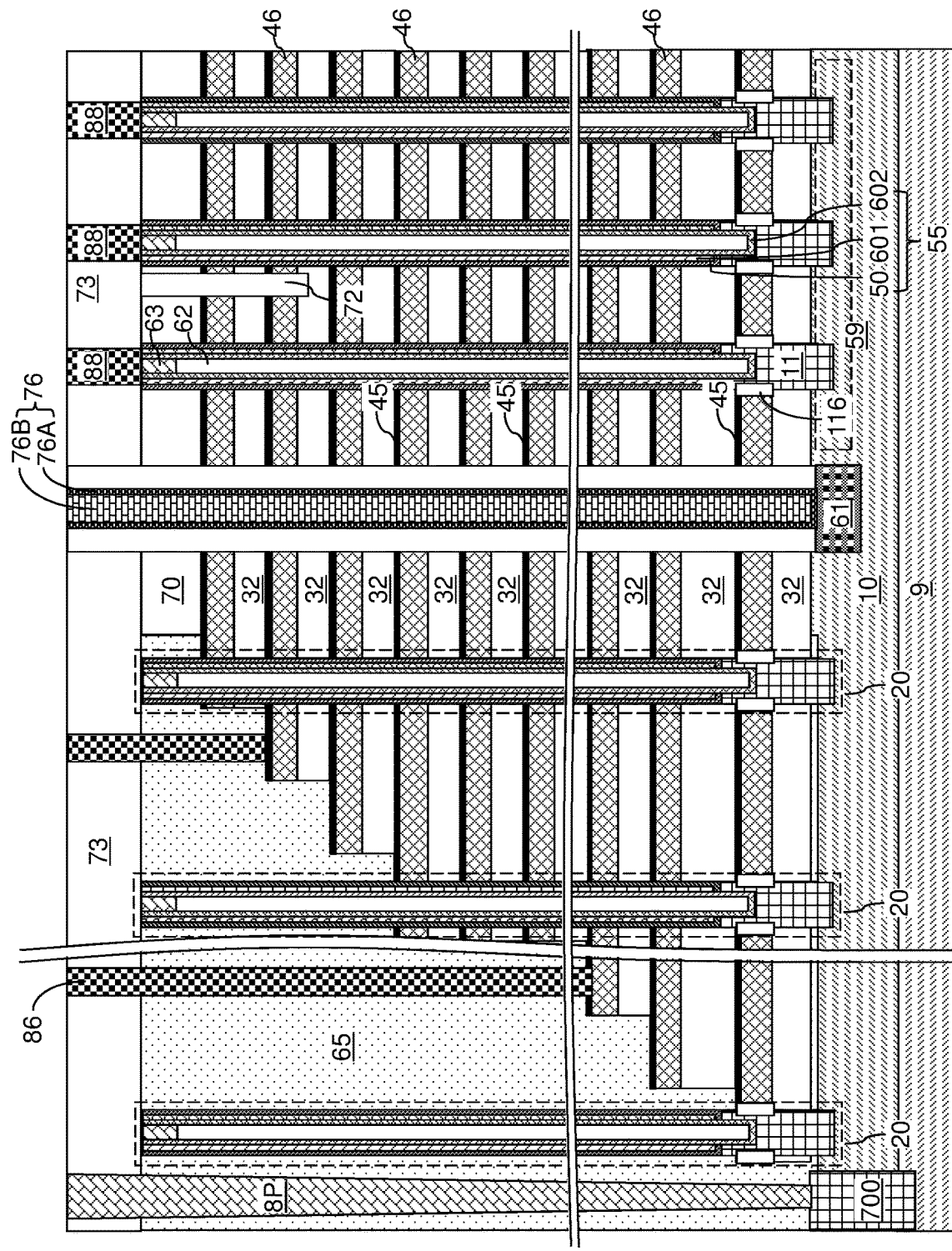
FIG. 12A is a schematic vertical cross-sectional view of the exemplary structure after formation of additional contact via structures according to an embodiment of the present disclosure.
Figure 12B:
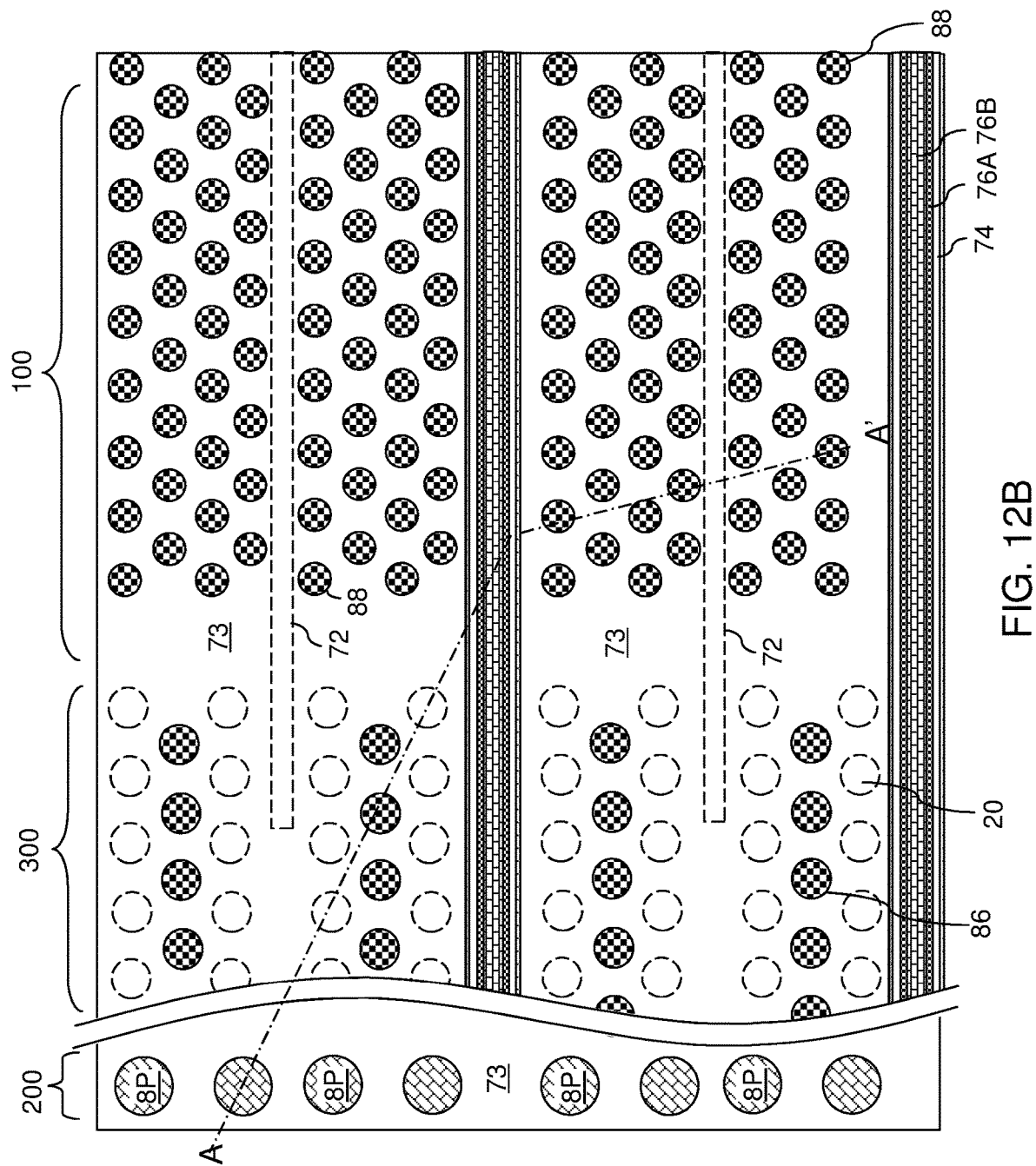
FIG. 12B is a top-down view of the exemplary structure of FIG. 12A. The vertical plane A-A' is the plane of the schematic vertical cross-sectional view of FIG. 12A.

Referring to FIGS. 12A and 12B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 13:
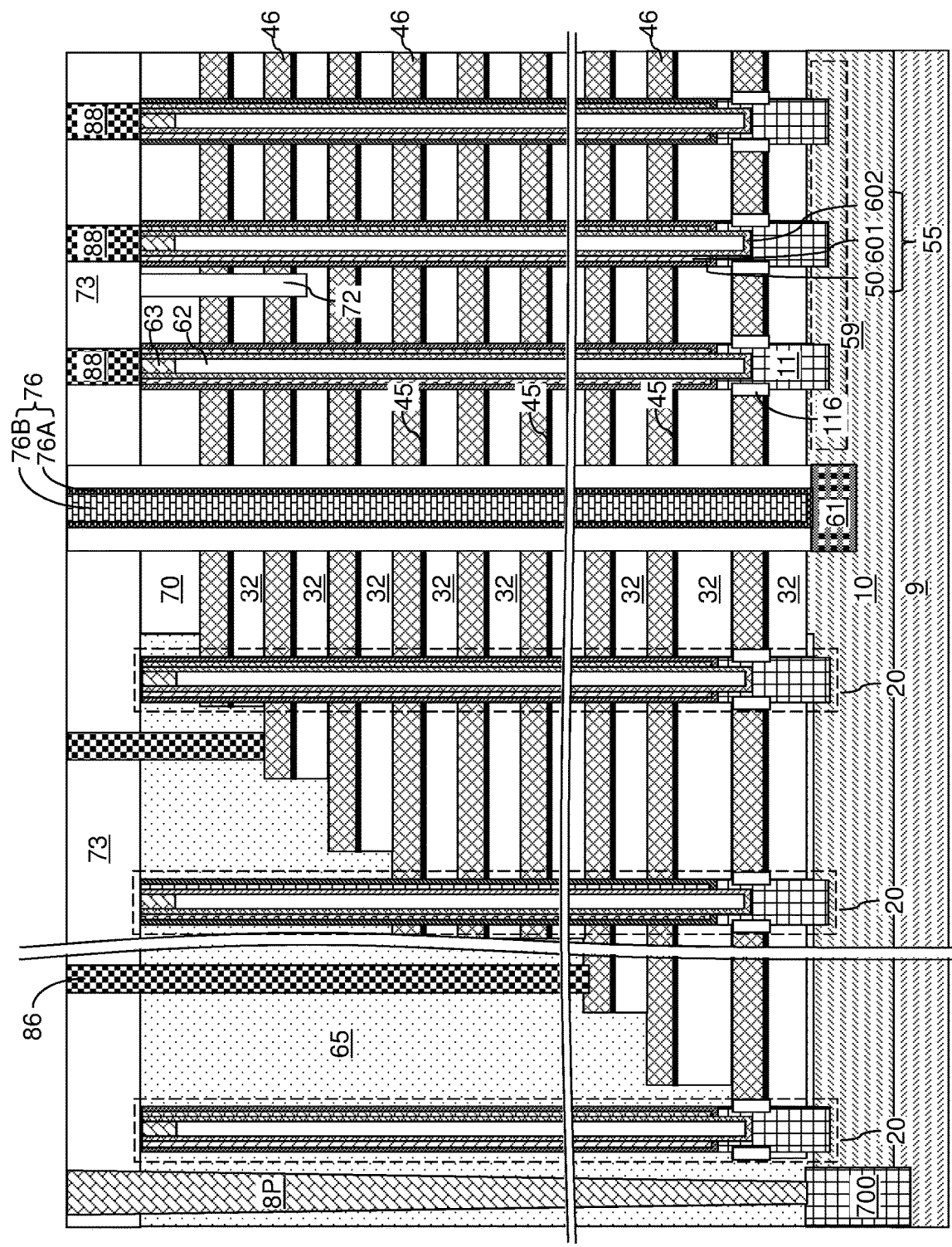
FIG. 13 is a schematic vertical cross-sectional view of an alternative configuration of the exemplary structure after formation of additional contact via structures according to an embodiment of the present disclosure.

Referring to FIG. 13, an alternative configuration of the exemplary structure can be derived from the exemplary structure by alternating the order of layers in each unit layer stack. Specifically, each unit layer stack as formed by the processing steps of FIG. 2 includes, from bottom to top, an insulating layer 32, a nucleation promoter layer 45, and a sacrificial material layer 45. Backside recesses 43 can be formed by removing the sacrificial material layers 42 selectively to the insulating layers 32 and the nucleation promoter layers 45 at the processing steps of FIGS. 8A and 8B. Electrically conductive layers 46 (and variable-thickness voids 47 if present) can be formed within the volumes of the backside recesses 43 at the processing steps of FIGS. 9A and 9B. In this case, the three-dimensional memory device as completed at the processing steps of FIGS. 12A and 12B can include vertical repetitions (32, 45, 46) including multiple repetitions of a unit layer stack that includes, from bottom to top, an insulating layer 32, a nucleation promoter layer 45, and an electrically conductive layer 46.

Referring to all drawings and according to various embodiments of the present disclosure, a three-dimensional memory device is provided that comprises: a vertical repetition (32, 46, 45) of a unit layer stack including an insulating layer 32, an electrically conductive layer 46, and a nucleation promoter layer 45 located over a substrate (9, 10); and memory stack structures 55 extending through the vertical repetition (32, 46, 45), in which each of the memory stack structures 55 comprises a memory film 50 and a vertical semiconductor channel 60.

In one embodiment, each nucleation promoter layer 45 within the vertical repetition (32, 46, 45) is in direct contact with a respective one of the insulating layers 32 within the vertical repetition (32, 46, 45) and in direct contact with a respective one of the electrically conductive layers 46 within the vertical repetition (32, 46, 45).

In one embodiment, each nucleation promoter layer 45 within the vertical repetition (32, 46, 45) is in direct contact with a bottom surface of the respective one of the insulating layers 32 within the vertical repetition (32, 46, 45). Alternatively, each nucleation promoter layer 45 within the vertical repetition (32, 46, 45) is in direct contact with a top surface of the respective one of the insulating layers 32 within the vertical repetition (32, 46, 45).

In one embodiment, the unit layer stack (32, 46, 45) consists of the insulating layer 32, the electrically conductive layer 46, and the nucleation promoter layer 45.

In one embodiment, each unit layer stack other than a topmost one or a bottommost one of the unit layer stacks within the vertical repetition (32, 46, 45) is in direct contact with a respective overlying one of the unit layer stacks and in direct contact with a respective underlying one of the unit layer stacks.

In one embodiment, each of the nucleation promoter layers 45 within the vertical repetition (32, 46, 45) comprises a metallic element-containing material. In one embodiment, the metallic element-containing material is selected from W, Ti, Ta, Co, Ru, Mo, tungsten silicide, titanium silicide, tantalum silicide, titanium silicon nitride, tungsten carbon nitride, titanium oxide, tantalum nitride, tungsten nitride, or combinations thereof (such as an alloy or a multilayer stack).

In one embodiment, each of the nucleation promoter layers 45 within the vertical repetition (32, 46, 45) comprises a non-metallic material that is substantially free of any metallic element. In one embodiment, the non-metallic material comprises a material selected from silicon, germanium, a silicon-germanium alloy, and boron.

In one embodiment, each of the electrically conductive layers 46 comprises at least one metal selected from tungsten, ruthenium, cobalt, and molybdenum.

In one embodiment, a thickness of a nucleation promoter layer 45 is less than 25% of a thickness of an electrically conductive layer 46 (such as the maximum thickness of the electrically conductive layer 46) within each unit layer stack.

In one embodiment, each of the memory stack structures 55 is located within a respective memory opening 49 that extends through, and is laterally surrounded by, the vertical repetition (32, 46, 45) of the unit layer stack.

In one embodiment, each memory film 50 within the memory stack structures 55 comprises: a blocking dielectric 52 in direct contact with a plurality of insulating layers 32, a plurality of electrically conductive layers 46, and a plurality of nucleation promoter layers 45 within the vertical repetition (32, 46, 45) of the unit layer stack; a charge storage layer 54 contacting the blocking dielectric 52; and a tunneling dielectric 56 contacting the charge storage layer 54 and contacting a respective one of the vertical semiconductor channels 60.

In one embodiment, the vertical repetition (32, 46, 45) of the unit layer stack comprises a terrace region in which each electrically conductive layer 46 other than a topmost electrically conductive layer within the vertical repetition laterally extends farther than any overlying electrically conductive layer within the vertical repetition (32, 46, 45); the terrace region includes stepped surfaces of the vertical repetition (32, 46, 45) that continuously extend from a bottommost layer within the vertical repetition (32, 46, 45) to a topmost layer within the vertical repetition (32, 46, 45); and support pillar structures 20 extend through the stepped surfaces and through a retro-stepped dielectric material portion 65 that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60) in which at least one end portion 60 of each of the plurality of semiconductor channels (59, 11, 60) extends substantially perpendicular to a top surface of the substrate (9, 10) and comprises a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The electrically conductive layers 46 of various embodiments are free of metal seams within a conductive material because the growth of the metal fill material is unidirectional, i.e., either upward or downward within each of the backside recesses 43. The average grain size of the electrically conductive layers 46 can be much larger than the average grain size of an electrically conductive layer formed by omnidirectional growth of a conductive material from all physically exposed surfaces of a backside recess having comparable dimensions of the backside recesses 43 of the devices of various embodiments because the growth distance for the electrically conductive layers 46 of various embodiments is about double the growth distance for electrically conductive layers formed by omnidirectional growth. Further, if a nucleation layer is used, the thickness occupied by the nucleation layer within each electrically conductive layer 46 is only one half of the total thickness of a nucleation layer in an electrically conductive layer formed by omnidirectional growth because the nucleation layer is formed only on one side (i.e., a bottom side or a top side) of the electrically conductive layer 46. Thus, the electrically conductive layers 46 of the devices of and made according to according to various embodiments provided a lower resistance than electrically conductive layers formed by omnidirectional growth that are formed in a same volume. Further, the electrically conductive layers 46 of the devices of and made according to according to various embodiments are conducive to scaling of a three-dimensional memory device.

The seamless electrically conductive layers 46 of the embodiments of the present disclosure provide additional non-limiting advantages. First, the lack of seams lowers the resistivity of the metallic material in the electrically conductive layers 46, such as, for example, through formation of bigger grains. Second, in case tungsten is employed for the electrically conductive layers 46, seams in tungsten material portions function as trapping regions for residual fluorine (which is the byproduct of a CVD/ALD process used to deposit tungsten from tungsten hexafluoride precursor). The seamless electrically conductive layers 46 of the present disclosure remove trapping regions for such residual fluorine. Trapped fluorine atoms can slowly diffuse through into critical device layers and etch various device components over time. Fluorine-related reliability issues can be significantly reduced by removing such fluorine trapping regions. Third, seams in prior art electrically conductive layers are vulnerable to penetration by an etchant chemical that is used in a metal recess etch process. In this case, the etchant chemical can easily can penetrate into the inner portions of the prior art electrically conductive layers through the seams, especially if wet chemistries are used. Etchant chemical penetration problem in prior art methods can be avoided or reduced by eliminating the seams in the electrically conductive layers 46 of the present disclosure.

The unidirectional metal growth provides an additional advantage. In case a lateral separation distance between neighboring pairs of memory openings becomes too small (for example, less than the height of the backside recesses), gap portions of the backside recesses between memory opening fill structures can be "pinched off" because lateral growth of the metallic material of prior art electrically conductive layers from the sidewall surfaces of the memory opening fill structures can close the gap portions. The smaller lateral separation distance between neighboring pairs of memory openings can occur due to a larger memory opening diameter relative to word line height, which is the height of the backside recesses. In such cases, there is no precursor transport to inner portions of prior art backside recesses that are spaced from the backside trenches. Lack of precursor transport to the inner portions of the prior art backside recesses causes formation of voids in the central regions of prior art electrically conductive layers (e.g., word lines), which causes fluorine-related problems and resistivity increase. If the lateral separation distance between neighboring pairs of memory openings shrinks much faster than the height of the electrically conductive layers, the formation of voids in prior art electrically conductive layers will be exacerbated. The methods of the embodiments of the present disclosure reduces or prevents growth of metal from sidewalls of the memory opening fill structures (such as sidewalls of the blocking dielectrics 52), and thus, reduces or prevents pinch-off and void formation in the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a vertical repetition of a unit layer stack including an insulating layer, an electrically conductive layer, and a nucleation promoter layer located over a substrate; and
   memory stack structures extending through the vertical repetition, wherein each of the memory stack structures comprises a memory film and a vertical semiconductor channel;

wherein each memory film within the memory stack structures comprises:
- a blocking dielectric in direct contact with a plurality of insulating layers, a plurality of electrically conductive layers, and a plurality of nucleation promoter layers within the vertical repetition of the unit layer stack;
- a charge storage layer contacting the blocking dielectric; and
- a tunneling dielectric contacting the charge storage layer and contacting a respective one of the vertical semiconductor channels.

2. The three-dimensional memory device of claim 1, wherein each nucleation promoter layer within the vertical repetition is in direct contact with a respective one of the insulating layers within the vertical repetition and in direct contact with a respective one of the electrically conductive layers within the vertical repetition.

3. The three-dimensional memory device of claim 2, wherein each nucleation promoter layer within the vertical repetition is in direct contact with a bottom surface of the respective one of the insulating layers within the vertical repetition.

4. The three-dimensional memory device of claim 2, wherein each nucleation promoter layer within the vertical repetition is in direct contact with a top surface of the respective one of the insulating layers within the vertical repetition.

5. The three-dimensional memory device of claim 1, wherein the unit layer stack consists of the insulating layer, the electrically conductive layer, and the nucleation promoter layer.

6. The three-dimensional memory device of claim 1, wherein each unit layer stack other than a topmost one or a bottommost one of the unit layer stacks within the vertical repetition is in direct contact with a respective overlying one of the unit layer stacks and in direct contact with a respective underlying one of the unit layer stacks.

7. The three-dimensional memory device of claim 1, wherein each of the nucleation promoter layers within the vertical repetition comprises a metallic element-containing material.

8. The three-dimensional memory device of claim 1, wherein each of the nucleation promoter layers within the vertical repetition comprises a non-metallic material comprising boron or silicon.

9. The three-dimensional memory device of claim 1, wherein each of the electrically conductive layers comprises at least one metal selected from tungsten, ruthenium, cobalt, and molybdenum.

10. The three-dimensional memory device of claim 1, wherein a thickness of a nucleation promoter layer is less than 25% of a thickness of an electrically conductive layer within each unit layer stack.

11. The three-dimensional memory device of claim 1, wherein each of the memory stack structures is located within a respective memory opening that extends through, and is laterally surrounded by, the vertical repetition of the unit layer stack.

12. The three-dimensional memory device of claim 1, wherein:
- the vertical repetition of the unit layer stack comprises a terrace region in which each electrically conductive layer other than a topmost electrically conductive layer within the vertical repetition laterally extends farther than any overlying electrically conductive layer within the vertical repetition;
- the terrace region includes stepped surfaces of the vertical repetition that continuously extend from a bottommost layer within the vertical repetition to a topmost layer within the vertical repetition; and
- support pillar structures extend through the stepped surfaces and through a retro-stepped dielectric material portion that overlies the stepped surfaces.

13. A three-dimensional memory device, comprising:
- a vertical repetition of a unit layer stack including an insulating layer, an electrically conductive layer, and a nucleation promoter layer located over a substrate; and
- memory stack structures extending through the vertical repetition, wherein each of the memory stack structures comprises a memory film and a vertical semiconductor channel;

wherein:
- the vertical repetition of the unit layer stack comprises a terrace region in which each electrically conductive layer other than a topmost electrically conductive layer within the vertical repetition laterally extends farther than any overlying electrically conductive layer within the vertical repetition;
- the terrace region includes stepped surfaces of the vertical repetition that continuously extend from a bottommost layer within the vertical repetition to a topmost layer within the vertical repetition; and
- support pillar structures extend through the stepped surfaces and through a retro-stepped dielectric material portion that overlies the stepped surfaces.

* * * * *